(12) United States Patent
Catalano

(10) Patent No.: US 10,485,066 B2
(45) Date of Patent: Nov. 19, 2019

(54) LAMP WITH VARIABLE-BEAM OUTPUT BY DISCRETELY ACTIVATING LED LIGHT SOURCES

(71) Applicant: LEDVANCE LLC, Wilmington, MA (US)

(72) Inventor: Anthony W. Catalano, Boulder, CO (US)

(73) Assignee: LEDVANCE LLC, Wilmington, MA (US)

( * ) Notice: Subject to any disclaimer, the term of this patent is extended or adjusted under 35 U.S.C. 154(b) by 314 days.

(21) Appl. No.: 14/903,209

(22) PCT Filed: Jul. 9, 2014

(86) PCT No.: PCT/US2014/045997
§ 371 (c)(1),
(2) Date: Jan. 6, 2016

(87) PCT Pub. No.: WO2015/006478
PCT Pub. Date: Jan. 15, 2015

(65) Prior Publication Data
US 2016/0381749 A1    Dec. 29, 2016

(51) Int. Cl.
*F21V 14/00*       (2018.01)
*H05B 33/08*       (2006.01)
(Continued)

(52) U.S. Cl.
CPC ....... *H05B 33/0845* (2013.01); *F21V 7/0091* (2013.01); *F21V 7/048* (2013.01);
(Continued)

(58) Field of Classification Search
CPC ... F21V 7/048; F21V 7/06; F21V 7/07; F21V 14/02; H05B 33/0845
See application file for complete search history.

(56) References Cited

U.S. PATENT DOCUMENTS 4,602,321 A    7/1986  Bornhorst
5,752,766 A *  5/1998  Bailey ................. F21V 19/02
                                                 362/231

(Continued)

FOREIGN PATENT DOCUMENTS

CN       102958251 A      3/2013
DE    202010016958 U1     6/2011
(Continued)

OTHER PUBLICATIONS

Clay Paky, "A.LEDA Top Performance Moving Head LED-Wash", KTEAEA Nov. 29, 2013, p. 7, Publisher: Website located at http://www.claypaky.it/media/documents/Clay_Paky_Aleda_Wash_Brochure_EN.pdf.

(Continued)

*Primary Examiner* — Ismael Negron
(74) *Attorney, Agent, or Firm* — Neugboren O'Dowd PC

(57) ABSTRACT

Lamp including an array of LEDs disposed at or near the focus of a reflecting optic having multiple segments with different aiming angles (i.e. the angle corresponding to a reflected beam output direction), and a driver circuit for discretely activating some of the LEDs in the array. The angular distribution of the output light beam (e.g., the beam divergence) is adjusted by selectively changing the currents supplied to the LEDs.

31 Claims, 25 Drawing Sheets

(51) Int. Cl.

| | | |
|---|---|---|
| *F21V 7/04* | (2006.01) | |
| *H01L 33/62* | (2010.01) | |
| *F21V 7/00* | (2006.01) | |
| *F21V 7/06* | (2006.01) | |
| *F21V 23/00* | (2015.01) | |
| *F21V 23/06* | (2006.01) | |
| *G03B 21/20* | (2006.01) | |
| *H01L 25/075* | (2006.01) | |
| *H01L 25/00* | (2006.01) | |
| *H01L 33/00* | (2010.01) | |
| *H01L 33/38* | (2010.01) | |
| *H01L 33/48* | (2010.01) | |
| *F21Y 115/10* | (2016.01) | |
| *F21Y 113/13* | (2016.01) | |

(52) U.S. Cl.
CPC ............. *F21V 7/06* (2013.01); *F21V 23/005* (2013.01); *F21V 23/06* (2013.01); *G03B 21/208* (2013.01); *H01L 25/075* (2013.01); *H01L 25/50* (2013.01); *H01L 33/0041* (2013.01); *H01L 33/38* (2013.01); *H01L 33/486* (2013.01); *H01L 33/62* (2013.01); *H05B 33/089* (2013.01); *F21Y 2113/13* (2016.08); *F21Y 2115/10* (2016.08); *H01L 2933/0016* (2013.01); *H01L 2933/0066* (2013.01)

(56) References Cited

U.S. PATENT DOCUMENTS

| | | | |
|---|---|---|---|
| 5,789,866 A | 8/1998 | Keith et al. | |
| 5,806,955 A | 9/1998 | Parkyn, Jr. et al. | |
| 5,986,819 A | 11/1999 | Steinblatt | |
| 6,016,038 A * | 1/2000 | Mueller | H05B 33/0857 |
| | | | 315/291 |
| 6,109,766 A * | 8/2000 | Baliozian | F21V 7/0008 |
| | | | 362/233 |
| 6,357,893 B1 * | 3/2002 | Belliveau | F21L 4/027 |
| | | | 362/285 |
| 6,488,398 B1 | 12/2002 | Bloch et al. | |
| 6,566,824 B2 | 5/2003 | Panagotacos et al. | |
| 6,796,690 B2 | 9/2004 | Bohlander | |
| 6,951,418 B2 * | 10/2005 | Rizkin | F21V 5/046 |
| | | | 362/153.1 |
| 6,985,627 B2 | 1/2006 | Banton | |
| 7,006,306 B2 | 2/2006 | Falicoff et al. | |
| 7,329,029 B2 | 2/2008 | Chaves et al. | |
| 7,329,982 B2 * | 2/2008 | Conner | H01L 33/58 |
| | | | 257/98 |
| 7,605,547 B2 | 10/2009 | Ng | |
| 7,758,208 B2 | 7/2010 | Bailey | |
| 7,808,581 B2 | 10/2010 | Panagotacos et al. | |
| 8,096,670 B2 * | 1/2012 | Trott | F21S 8/02 |
| | | | 362/147 |
| 8,337,030 B2 * | 12/2012 | Pickard | B60Q 1/0052 |
| | | | 362/84 |
| 8,436,554 B2 | 5/2013 | Zhao et al. | |
| 8,485,684 B2 * | 7/2013 | Lou | F21V 7/005 |
| | | | 362/217.05 |
| 9,470,406 B2 * | 10/2016 | Catalano | H05B 33/0845 |
| 2004/0264185 A1 | 12/2004 | Grotsch et al. | |
| 2008/0062682 A1 | 3/2008 | Hoelen et al. | |
| 2008/0238338 A1 * | 10/2008 | Latham | A61B 5/0059 |
| | | | 315/294 |
| 2009/0046303 A1 | 2/2009 | Dimitrov-Kuhl et al. | |
| 2009/0046454 A1 | 2/2009 | Bertram et al. | |
| 2009/0219716 A1 | 9/2009 | Weaver et al. | |
| 2010/0065860 A1 | 3/2010 | Vissenberg et al. | |
| 2010/0097809 A1 | 4/2010 | Munro et al. | |
| 2010/0296283 A1 | 11/2010 | Taskar et al. | |
| 2011/0108860 A1 | 5/2011 | Eissler et al. | |
| 2011/0149581 A1 | 6/2011 | Jiang | |
| 2011/0182065 A1 | 7/2011 | Negley et al. | |
| 2011/0260647 A1 | 10/2011 | Catalano et al. | |
| 2012/0014107 A1 | 1/2012 | Avila | |
| 2012/0018745 A1 | 1/2012 | Liu et al. | |
| 2012/0043563 A1 | 2/2012 | Ibbetson | |
| 2012/0319616 A1 * | 12/2012 | Quilici | F21V 5/007 |
| | | | 315/294 |
| 2013/0058103 A1 | 3/2013 | Jiang et al. | |
| 2013/0058104 A1 | 3/2013 | Catalano | |
| 2013/0076804 A1 | 3/2013 | Tanaka et al. | |
| 2013/0170220 A1 | 7/2013 | Bueeler et al. | |
| 2014/0084809 A1 | 3/2014 | Catalano | |
| 2015/0009677 A1 | 1/2015 | Catalano | |
| 2017/0023211 A1 * | 1/2017 | Sepkhanov | F21S 8/085 |

FOREIGN PATENT DOCUMENTS

| | | | | |
|---|---|---|---|---|
| DE | 102012201494 A1 * | 8/2012 | | F21S 10/00 |
| DE | 102012201494 A1 | 8/2012 | | |
| EP | 2093482 A2 | 8/2009 | | |
| JP | 03270561 A | 12/1991 | | |
| WO | 2005060376 A2 | 7/2005 | | |
| WO | 2007067513 A2 | 6/2007 | | |
| WO | 2008152561 A1 | 12/2008 | | |
| WO | 2010015820 A1 | 2/2010 | | |
| WO | 2010127217 A1 | 11/2010 | | |
| WO | 2011062629 A1 | 5/2011 | | |
| WO | 2014047621 A1 | 3/2014 | | |
| WO | 2015006478 A1 | 1/2015 | | |

OTHER PUBLICATIONS

Doucet, Michel et al., "New Concept for a Wide-Angle Collimated Display", Sep. 27, 2008, p. 1, Publisher: 3roceedings of SPIE Abstract Only.

Ebay, "FRC-M1-MCE-0R LED Lens Reflector for CREE MC-E 35mm Textured Facets", "Webpage located at http://www.ebay.co.uk/itm/FRC-M1-MCE-0R-LED-Lens-Reflector-for-CREE-MC-E-35mm-textured-facets-QTY-1pcs-/131646672749", Known as of Nov. 2015, p. 7, Publisher: Ebay, Published in: US.

Ebay, "FRC-M2-MCE-0R LED Lens Reflector for CREE MC-E 35mm Polished Facets", "Webpage located at http://www.ebay.co.uk/itm/FRC-M2-MCE-0R-LED-Lens-Reflector-for-CREE-MC-E-35mm-polished-facets-QTY-1pcs-/131646673563", Known as of Nov. 2015, p. 7, Publisher: Ebay, Published in: US.

Henry, William, "MicroLED Arrays Find Applications in the Very Small", Mar. 2013, p. 6 Publisher: Photonics Spectra.

Hernandez, I., "Highly Efficient Individually Addressable Diode Lasers at 830nm Grown by Solid Source Molecular Beam Epitaxy", Dec. 2001, pp. 7-9, vol. 13, Publisher: Sociedad Mexicana de Ciencia de Superficies y de Vacio.

Lamps 2 U Direct, "Impact 5 Watt Blue Coloured GU10 LED Light Bulb", "Webpage located at http://www.lamps2udirect.com/led-light-bulbs/impact-5-watt-blue-coloured-gu10-led-light-bulb/142199", Known as of Nov. 2015, p. 6, Publisher: Lamps 2 U Direct.

Menn, Patrick, "International Search Report and Written Opinon re Application No. PCT/US2013/061378", Nov. 29, 2013, p. 8.

Jeon, C.W. et al., "Fabrication of Two-Dimensional InGaN-Based Micro-LED Arrays", Jul. 12, 2002, pp. 325-328, vol. 192, No. 2, Publisher: Physica Status Solidi.

The Home Depot, "20W Equivalent Soft White (2700K) PAR38 Dimmable LED Flood Light Bulb", "Webage located at http://www.homedepot.com/p/Lithonia-Lighting-20W-Equivalent-Soft-White-2700K-PAR38-Dimmable-LED-Flood-Light-Bulb-ALSP38-1200L-45-DIM", Known as of Nov. 2015, p. 8, Publisher: Lithonia Lighting.

Neukem, Jorg, "High-Power Diode Laser Bars in the Printing Industry", Jul. 2011, pp. 22-23, No. 4, Publisher: Laser Technik Journal.

Omei Lighting, "MR16 5 W Cob 450-480LM 2700-3500K Warm White Light LED Spot Bulb 12V", "Webpage located at http://www.omailighting.com/product/mr16-5w-cob-450-480lm-2700-

(56) References Cited

OTHER PUBLICATIONS 3500k-warm-white-light-led-spot-bulb-12v.html", Known as of Nov. 2015, p. 3, Publisher: Omei Lighting.

Parkyn, William A. et al., "Converging TIR Lens for Nonimaging Concentration of Light from Compact Incoherent Sources", Nov. 1, 1993, p. 2, Publisher: Proceeding SPIE Abstract Only.

Poher, V. et al., "Micro-LED Arrays: A Tool for Two-Dimensional Neuron Stimulation", Apr. 4, 2008, p. 3, Publisher: Journal of Physics.

Rosenkrantz, L. Jay et al., "Light-Emitting Diode (LED) Arrays for Optical Recorders", Feb. 12, 1980, p. 1, Publisher: Proceedings of SPIE Abstract Only.

Skabara, Peter J. et al., "Low-Threshold Organic Semiconductor Lasers: Moving Out of the Laboratory", Nov. 29, 2010, p. 3.

Super Bright LEDs, "5 Watt MR16 LED Bulb-Multifaceted Lens With High Power Epistar Cob LED", "Webpage located at https://www.superbrightleds.com/moreinfo/led-household-bulbs/5-watt-mr16-led-bulb--multifaceted-lens-with-high-power-epistar-cob-le", Known as of Nov. 2015, p. 4, Publisher: Super Bright LEDs.

Menn, Patrick, "European Office Action re Application No. 13773521.3", dated Feb. 11, 2016, p. 5, Published in: EP.

Prouteau, Evelyne, "Invitation to Pay Additional Fees re Application No. PCT/US2014/045997", dated Oct. 24, 2014, p. 5.

Becamel, Philippe, "International Preliminary Report on Patentability re Application No. PCT/US2013/061378", dated Mar. 24, 2014, p. 6.

Dehestru, Bastien, "International Search Report and Written Opinion re Application No. PCT/US2014/045997", dated Jan. 5, 2015, p. 17.

Menn, Patrick, "Written Opinion of the International Searching Authority re Application No. PCT/US2013/061378", dated Mar. 24, 2014, p. 5.

Pham, Thai N., "Office Action re Application No. 14035027", dated Feb. 5, 2016, p. 49, Published in: US.

Pham, Thai N., "Office Action re Application No. 14035027", dated Aug. 28, 2015, p. 50, Published in: US.

Gruber, Stephen S., "Response to Office Action re Application No. 14035027", dated Nov. 24, 2015, p. 11, Published in: US.

European Patent Office, "European Office Action re Application No. 14752451.6", dated Feb. 16, 2016, p. 2, Published in: EP.

\* cited by examiner 6 mm APERTURE RADIUS

| DESIGN ANGLE | -80 | -70 | -60 | -50 | -40 | -30 |
|---|---|---|---|---|---|---|
| # LEDs ON 4 | 1.00 | 1.00 | 1.00 | 1.00 | 1.00 | 1.00 |
| 24 | 1.82 | 1.96 | 2.11 | 2.11 | 2.25 | 2.42 |

FIG. 4A 12 mm RADIUS
DESIGN ANGLE  -50 Degrees

|  | BEAM ANGLE | CBCD |
|---|---|---|
| 88 LEDs ON | 26.6 | 23937 |
| 4 LEDs ON | 5.7 | 17760 |
| RATIO | 1:4.6 | 1:1.35 |

FIG. 4B 12 mm RADIUS
DESIGN ANGLE  -50 Degrees

|  | BEAM ANGLE | CBCd |
|---|---|---|
| 88 LEDs ON | 61.7 | 8167 |
| 4 LEDs ON | 10 | 1473 |
| RATIO | 1:6.2 | 1:5.5 |

12 mm RADIUS
DESIGN ANGLE  -50 Degrees Dual

|  | BEAM ANGLE | CBCd |
|---|---|---|
| 88 LEDs ON | 36.8 | 14361 |
| 4 LEDs ON | 6.4 | 8842 |
| RATIO | 1:5.75 | 1:1.62 |

LAMP WITH VARIABLE-BEAM OUTPUT BY DISCRETELY ACTIVATING LED LIGHT SOURCES

CROSS-REFERENCE TO RELATED APPLICATION

This application claims priority to and the benefit of U.S. patent application Ser. No. 14/035,027 (filed on Sep. 24, 2013) and U.S. Provisional Application No. 61/844,156 (filed on Jul. 9, 2013). The foregoing applications are incorporated herein by reference in their entireties.

TECHNICAL FIELD

The present invention relates generally to adjustable light sources, and in various embodiments more specifically to light sources comprising multiple individually controllable light-emitting diodes.

BACKGROUND

Light-emitting diodes (LEDs), particularly white LEDs, have increased in size in order to provide the total light output needed for general illumination. As LED technology has advanced, the efficacy (measured in lumens/Watt) has gradually increased, such that smaller dies now produce as much light as was previously created by emission from far larger die areas. Nonetheless, the trend favoring higher light outputs has led to larger semiconductor LED die sizes, or, for convenience, arrays of smaller dies in series or series-parallel arrangements. Series arrangements are generally favored because the forward voltage of LEDs varies slightly, resulting, for parallel arrangements, in an uneven distribution of forward currents and, consequently, uneven light output.

For many applications, it is desirable to have a light source that produces a light beam whose angular distribution can be varied. Variability is needed, for example, to create a wide-angle light beam for illuminating an array of objects, or a narrow-angle beam for illuminating a single, small object. Conventionally, the angular distribution is varied by moving the light source(s) (e.g., the LED arrangement) toward or away from the focal point of a lens or parabolic mirror. As the light source is moved away from the focal point, its image is blurred, forming a wider beam. Unfortunately, in doing so, the image is degraded, becoming non-uniform; in the case of the familiar parabolic reflector used in flashlights, a dark "donut hole" is formed, which is visually undesirable and sacrifices full illumination of the scene. Furthermore, moving the lens often reduces the collection efficiency of the lens, as light that is not refracted by a lens or reflected by a reflector surface is lost.

Because of these optical artifacts and efficiency losses, most light sources use a single, fixed lens. For light bulbs such as, e.g., MR-16 halogen bulbs, several different types of optics are manufactured to create beams of various beam divergences, ranging from narrow beam angles ("spot lights") to wide angles ("flood lights"), with various degrees in between. Unless the user maintains different light bulbs on hand to accommodate all potentially desired beam divergences, however, he will generally be limited to one or a small number of alternatives. Traveling with an assortment of bulbs for portable light sources is even less realistic. As a result, users often tolerate either a source ill-suited to changing or unexpected conditions, or the poor optical quality of light sources with variable beam optics. A need, therefore, exists for light sources that produce variable beam angles without sacrificing beam quality.

When LEDs are utilized as a light source, they are generally arranged in clusters or arrays to coincide with particular design specifications to provide a desired light output. The LED arrays combine the higher efficiency, increased lifetime, and reliability benefits of LEDs with the light output levels of many conventional light sources to serve the general lighting market, including street lights, commercial lighting and consumer applications. For example, with a proper fixture design, LED arrays can deliver a few times the energy efficiency of traditional lighting with a 30% reduction in cost. However, a single LED die in the LED array may fail during manufacture or operation due to the failure of, e.g., the LED die itself, a conductive path, a substrate or an electrical or mechanical connection of the LED to the conductive path; such LED failure can cause highly visible defects in the pattern of the luminous intensity and/or light uniformity, and in some cases can lead to failure of the entire LED array. It is therefore desirable to have individually addressable LEDs for mitigating the effects of a single LED failure. For example, upon detecting an LED failure, the LED driver circuitry may deactivate only the failed LED; the light output reduction resulting from the single LED deactivation may be on the order of 1%, which is generally unnoticeable to the observer. Additionally, the individually addressable LEDs may be selectively activated and deactivated, thereby providing flexible control over the overall illumination brightness and/or color. Conventional individually addressable LEDs, however, require electronic circuitry that typically occupies a significant surface area on the substrate upon which the LEDs are located; as a result, the LED packing efficiency is reduced.

Further, conventional LED arrays may suffer from a significant drop in lifetime due to inefficient dissipation of heat generated from the LEDs and/or electronic components associated therewith. This is because conventional LED arrays are preferably close-packed, i.e., have minimal spacing between the individual LED dies, on a printed circuit board (PCB) for reducing optical artifacts and providing beam uniformity. The PCB, however, has low thermal conductivity, and therefore, cannot quickly dissipate the waste heat generated during operation of the LED. Further, despite the desirability of LED close-packing, the spacing between conventional LED dies on the PCB can only be minimized to a certain degree because of minimum distance requirements between components on a PCB. For example, close-packed LED dies on a PCB typically have a distance of roughly 100 μm therebetween for wiring conducting line traces on the PCB.

Although it is feasible to include multiple conducting levels in a single PCB, thereby embedding the conducting traces (e.g., copper traces) below the LEDs without using "real estate" on the PCB surface alongside of the LED, the copper vias that extend through the PCB to contact the LEDs take up valuable area on the PCB surface; this, again, creates a spacing limitation between closely-packed LEDs. Such spatial resolution limitations, unfortunately, cannot easily be overcome by improving the LED package technology because it is a fundamental limitation of the predominant patterning approach used in currently available PCB fabrication technology.

Consequently, there is a need for an approach that can provide individually addressable LEDs without requiring valuable area on the substrate surface for the LED driver/support circuitry. Ideally, such an approach would provide effective close-packing of the LEDs while efficiently dissipating heat generated during LED operation.

SUMMARY

Embodiments of the present invention provide light sources that include an arrangement of individually controllable light-emitting devices (or individually controllable groups of light-emitting devices) fixedly located relative to (typically at or near the focus of) a concave reflecting optic and oriented to face in the same direction as the optic. These light sources can achieve variable beams by selectively driving the individual (groups of) light-emitting devices, e.g., depending on their distance from the center of the arrangement. For example, by turning on only light emitters at or near the center, a narrow beam of light is created, while turning on light emitters throughout the arrangement will create a wider-angle beam. Thus, beam divergence can be adjusted without physically moving the light-emitting devices relative to the optic, eliminating the degradation of the beam associated with too large a separation from the focus.

In various advantageous embodiments, the light-emitting devices are an LED array. However, other types of light emitters, such as, e.g., laser, incandescent, fluorescent, halogen, or high-intensity discharge lights, may also be used. The optic may generally be any suitably shaped reflector, whether implemented as a (glass-metal, dielectric, or other) mirror surface or a total internal reflector (TIR) (i.e., a solid structure, transmissive to light, whose interior surface reflects light incident thereon at an angle greater than a certain critical angle). In certain embodiments, a parabolic reflector is used, but spherical or other curved surfaces may also be employed. The aperture of the reflector is generally larger in diameter than the arrangement of light-emitting devices, in some embodiments by a factor of at least two; advantageously, a large aperture captures a large fraction of the light emitted from the light-emitting devices. The reflector and arrangement of the light-emitting devices are configured to create a directed, yet generally not completely collimated light beam, i.e., a beam of reflected light having non-zero divergence and an angular distribution that covers substantially less than 180° (e.g., in various embodiments, less than about 120°, less than about 90°, or less than about) 60°. The beam divergence generally results from the spatial extent of the light-emitting arrangement (and is sometimes enhanced by "spherical aberrations" (broadly understood) of any non-parabolic reflector); the larger the light-emitting arrangement is relative to the focal length of the reflector, the greater is typically the beam divergence. Advantageously, the non-zero beam divergence tends to entail greater beam uniformity, as any non-uniformities in the light-emitting arrangement will be blurred; in some embodiments, this effect is deliberately enhanced by faceting the reflector.

The output-beam divergence may be increased by increasing the size of the LED array (e.g., increasing the number of the LED dies and/or enlarging the size of each LED die) and the aperture radius to accommodate the LED array. For example, the maximum ratio of the wide beam angle to the narrow beam angle (or the range of beam angles) may increase by a factor of two when the radius of the aperture is doubled in size and the number of LEDs increases in proportion to the increased area while the individual LED size remains the same. In various embodiments, an alternative or further improvement is achieved by modifying the reflector without changing the dimensions of the LED array. In one embodiment, the reflector is constructed from a series of parabolic segments; each segment has a different parabolic profile (and therefore a different "aiming angle," i.e., the angle corresponding to the beam direction) to "address" each region of the LED array. For example, the reflector segments closer to the plane of the LED array can be more divergent (i.e., reflecting light emitted from the LED array at a larger angle relative to the symmetry axis of the paraboloid) than those further away from the LED plane. A greater distance between an off-axis LED and the center of the LED array results in a greater amount of light striking the reflector from the off-axis LEDs, due to the Lambertian light distribution of an LED. The segments of the reflector closer to the LED plane can direct a larger amount of light emitted from LEDs more distant from the array center in order to create a more divergent beam; as a result, the divergence angle of the beam increases. In addition, the LED array may be arranged such that the number of LEDs increases as the off-axis distance increases; this design provides more LED emitted light to the reflector segments close to LED plane (due to more off-axis LEDs), and again increases the beam angle. In some embodiments, the reflector is divided into two regions, one having multiple parabolic segments with graded beam angles for providing a large beam divergence and the other having a collimated beam parabolic segment for enhancing the center beam intensity at all angles.

In various embodiments, the LED arrangement is approximately uniform (i.e., the area density of the LEDs is uniform) to create a uniform area density of light and provide a Lambertian distribution of the light. For example, the layout of the LEDs may have a circular or radial symmetry but not both as excessive symmetry may lead to bright "ring patterns" detectable by human eyes. Having a circular or radially symmetric layout or uniform LED arrangement can advantageously provide a uniform center beam, without the need to have a dense pattern of LEDs to achieve beam uniformity. As a result, wiring the LEDs can be easier since they can be spaced relatively far apart and the LED array can be easily mounted on traditional PCBs or created using a semiconductor fabrication process. In addition, the intensity of the center beam may be adjusted to provide a high intensity of the narrow beam and/or a large divergence angle of the wide beam. Accordingly, in one embodiment, a driver is utilized to alter the power applied to (and switch on/off) individual LEDs or groups of LEDs. For example, the driver may adjust the center LEDs to have a lower intensity (or the driver may turn off the center LEDs completely) than that of the LEDs located near the outer circumference in order to produce a wide beam; the intensity of the center LED may be increased when a narrow beam is desired.

In some embodiments, the LED array is fabricated on a single substrate made of, for example, a semiconductor (e.g., a silicon wafer) or a ceramic material to allow closer spacing between the LED dies than on traditional PCBs, thereby reducing optical artifacts arising from the limited separation between LED dies disposed on a conventional PCB. For example, the LEDs may be formed of a compound (e.g., group III-V) semiconductor material and the substrate on which the LEDs are disposed may be a silicon wafer; well-developed semiconductor fabrication technology (e.g., doping, deposition, etching, or photolithography) may be utilized to produce high-resolution LED packing. In addition, conducting traces and/or electronic components may be fabricated three-dimensionally in the same substrate (e.g., embedded therewithin), thereby reducing the required substrate surface as well as creating an integrated device. The semiconductor substrate may allow the LED dies to be individually addressable or addressed in small groups using the conducting traces thereon or embedded therein. Additionally, each LED (or each group of LEDs) may be controlled using a signal synchronized to the driver circuitry; this provides additional flexibility in the addressing scheme. Further, the semiconductor substrate may act as a good thermal conductor that can efficiently dissipate heat generated from the LED dies and/or circuitry associated therewith, thereby increasing the operational lifetime of the array.

In one embodiment, the LEDs form a two-dimensional array and are attached to an imaging optic (e.g., a collimating optic) to project the light onto a surface for displaying a dot-matrix character. The resolution of the display is limited by the LED size and spacing between LEDs—i.e., as the size of individual LEDs decreases and/or the space therebetween diminishes, the resolution of the projected image increases. Therefore, using an LED array with a closer spacing (e.g., fabricated by the semiconductor process described above) allows a display of a more complex image as opposed to a character. In addition, multiple colors of LEDs that can be individually addressed or addressed in multiple groups (each having multiple LEDs) may be used with an optic to generate a wide range of colors of the projected image. In one implementation, a motor or other mechanical means is incorporated with the LED system to move the LED array for creating a large size and high resolution image without the need for increasing the dimension of the LED array.

Accordingly, in a first aspect, the invention pertains to a light source producing a beam of variable divergence. In various embodiments, the light source includes a concave reflecting optic, an (e.g., planar) arrangement of light-emitting devices (such as, e.g., LEDs) disposed fixedly relative to and oriented to face in the same direction as the reflecting optic, and driver circuitry for controlling drive currents to the light-emitting devices individually for each device or each of multiple groups of the devices. Light emitted by the light-emitting devices and reflected by the optic forms a light beam whose divergence can be variably controlled by controlling the drive currents.

The arrangement of light-emitting devices may be disposed substantially at a focus of the reflecting optic. As used herein, the "focus" of the reflecting optic refers to the point at which collimated light incident on the reflector parallel to its optical axis and reflected therefrom has its intensity maximum. A parabolic reflector, for instance, has a "true" focal point where all reflected rays (of rays incident on the reflector parallel to the optical axis) intersect. For nonparabolic reflectors, such as spherical reflectors, the reflected rays do not all intersect at the same point, but generally go through the same region (whose boundary may be defined, e.g., by a catacaustic), resulting in an intensity maximum at some point, which is herein considered the focus. An arrangement of light-emitting devices is deemed "substantially at the focus" if the center of the arrangement substantially coincides with the focus, meaning that the center is separated from the focus by no more than 10% (and, in some embodiments, by no more than 5%) of the focal length of the optic (i.e., the distance between the focus and the center of the reflector).

In some embodiments, the optic is or includes a parabolic reflector; in this case, the arrangement of light-emitting devices may be disposed substantially at a focal plane of the parabolic reflector (i.e., a plane through the focus). In other embodiments, the reflector is spherically, conically, or otherwise shaped. The reflecting optic may be faceted and/or textured. In various embodiments, the diameter of the reflecting optic is larger than (e.g., at least twice as large as) the width of the arrangement of light-emitting devices. The width of the arrangement of light-emitting devices, in turn, may be larger than (e.g., at least twice as large as) the focal length of the reflecting optic. In some embodiments, a light-emitting device located at the center of the arrangement is a higher-power device than one or more light-emitting devices located at a periphery of the arrangement.

The driver circuitry may be configured to control the drive currents to the light-emitting devices based on their respective positions and/or sizes (or the positions and/or sizes of groups of the devices). In some embodiments, the driver circuitry controls the drive currents based on the distance of the light-emitting devices from the center of the arrangement. For example, the circuitry may be configured to narrow the beam by providing non-zero drive currents only to light-emitting devices within a specified distance from the center. The circuitry may, further, be configured to uniformly vary the drive currents to all light-emitting devices to thereby vary the intensity of the beam, and/or to selectively drive a subset of the light-emitting devices so as to generate a pattern. In some embodiments, the circuitry is programmable.

In another aspect, the invention relates to a method of varying the divergence of a light source. The light source includes a concave reflecting optic (such as, e.g., a parabolic reflector) and, disposed fixedly relative to and oriented to face in the same direction as the reflecting optic, an arrangement of individually controllable light-emitting devices (such as, e.g., LEDs) or individually controllable groups of such devices. The method includes driving the light-emitting devices so as to create a light beam emerging from the focusing optic, and controlling the drive currents to the light-emitting devices based, at least in part, on their distance from a center of the arrangement so that the beam has a divergence variably determined by the controlled drive currents. Controlling the drive currents may involve decreasing the drive currents to LEDs in an outer region of the arrangement to thereby narrow the beam. The method may further include simultaneously and uniformly varying the drive currents to all LEDs to thereby vary the beam brightness. In some embodiments, the method includes programming driver circuitry for controlling the drive currents.

In another aspect, the invention relates to a light source producing a beam of variable divergence. In various embodiments, the light source includes multiple light-emitting devices arranged on a plane; a concave reflecting optic having an axis of symmetry and including multiple segments for redirecting light emitted thereon, light emitted by the light-emitting devices and reflected by the optic forming a light beam; and driver circuitry for controlling drive currents to the light-emitting devices individually or in groups thereof to thereby variably control the divergence of the light beam. In one implementation, each segment of the reflecting optic has an aiming angle with respect to the axis of symmetry; at least some of the segments have different aiming angles depending on their distances from the plane of the light-emitting devices. For example, the aiming angle of each segment with respect to the axis of symmetry may increase gradually as the distance between the segment and the plane of the light-emitting devices decreases. The reflecting optic may include the first and second edge segments having a shortest distance and a longest distance, respectively, from the plane of the light-emitting devices; in this case the first edge segment has the first aiming angle approximately equal to a desired divergence angle of the light beam and the second edge segment has the second aiming angle approximately parallel to the axis of symmetry for collimating the light beam. In another embodiment, the reflecting optic includes two regions; segments in the first region have relatively large aiming angles with respect to the axis of symmetry for providing divergence of the light beam and segments in the second region have relatively small aiming angles with respect to the axis of symmetry for collimating the light beam.

The segments may be parabolic and the light-emitting devices may be disposed substantially at a focus of the parabolic segments. Additionally, the light-emitting devices may be arranged in a pattern having a center, and the driver circuitry may be configured to control the drive currents to the light-emitting devices based on their distances from the center. In one embodiment, the driver circuitry is configured to narrow the beam by providing non-zero drive currents only to light-emitting devices within a specified distance from the center. In another embodiment, the light-emitting devices are arranged in a pattern having a center region and an outer region outside the center region; the driver circuitry is configured to decrease the drive currents to the light-emitting devices located in the center region to thereby increase a divergence angle of the beam. The driver circuitry can also be configured to decrease the drive currents to the light-emitting devices located in the outer region to thereby narrow the beam. As used herein, the "center region" may include all light-emitting devices except the sequence of light-emitting devices forming the periphery of the pattern. Alternatively, the "center region" may include only a fraction of the radial extent of the pattern—e.g., 10%, 20%, 50%, etc. The "outer region" typically includes all light-emitting devices outside the center region. Additionally, the driver circuitry may be programmable. In various embodiments, the driver circuitry is configured to selectively drive a subset of the light-emitting devices so as to generate a pattern.

The area density of the light-emitting devices may be uniform. For example, the arrangement of the light-emitting devices may be symmetric (e.g., circularly symmetric or radially symmetric). In various embodiments, the light-emitting devices are arranged in a pattern having a center region and an outer region outside the center region such that none of the light-emitting devices is located in the center region. The driver circuitry may be configured to control the drive currents based on the sizes and/or positions of respective light-emitting devices. In some embodiments, the light-emitting devices are arranged in a pattern having a center region and an outer region outside the center region; the light-emitting devices located in the center region are higher-power devices than light-emitting devices located in the outer region. In one implementation, the light-emitting devices consist of or include LEDs. The LEDs are disposed on a single substrate having multiple electrical contacts; the substrate includes or consists essentially of a semiconductor material.

Still another aspect of the invention relates to a method of varying the divergence of a light source having (i) multiple light-emitting devices arranged on a plane and in a pattern having a center region and an outer region outside the center region, and (ii) a concave reflecting optic having an axis of symmetry and including multiple segments; each segment has an aiming angle with respect to the axis of symmetry for redirecting light emitted thereon, and at least some of the segments having different aiming angles depending on their distances from the plane of the light-emitting devices. In various embodiments, the method includes driving the light-emitting devices to create a light beam emerging from the reflecting optic; and controlling drive currents to the light-emitting devices, individually or in groups thereof, based on distances of the devices from center region so that the beam has a divergence variably determined by, at least in part, the controlled drive currents.

Controlling the drive currents may include decreasing the drive currents to the light-emitting devices in an outer region thereof to thereby narrow the beam. In various embodiments, the light-emitting devices are arranged in a pattern having a center region and an outer region outside the center region; the step of controlling the drive currents includes decreasing the drive currents to the light-emitting devices in a center region thereof to thereby increase a divergence angle of the beam. In one implementation, the method further includes simultaneously and uniformly varying the drive currents to all LEDs to thereby vary the beam brightness.

In yet another aspect, a light system includes, in various embodiments, a single substrate having multiple electric contacts; disposed on the substrate, a light-emitting array having multiple LEDs; and multiple conducting traces, each connecting one of the LEDs to one of the electric contacts. In one implementation, at least one of the contacts is embedded within the substrate. The LED dies may include or consist essentially of a group III-V semiconductor material. The substrate may include or consist essentially of a semiconductor material (e.g., silicon) or an insulating material. The contacts may include ion-implanted regions. In one embodiment, the anodes of the LEDs in a row array are connected via the first set of conducting lines and cathodes of the LEDs in a column array are connected via the second set of conducting lines.

Additionally, the device may further include multiple field-effect transistors (FETs), each electrically connected to an LED via one of the contacts. The FETs may be embedded in the substrate. In some embodiments, source terminals of the FETs in the row array are connected via the first set of conducting lines, gate terminals of the FETs in the column array are connected via the second set of conducting lines, drain terminals are connected to anodes of the associated LEDs, and cathodes of the LEDs are connected to a common ground. The device may further include a controller for selectively activating or deactivating various ones of the LEDs via the associated FETs to achieve a desired pattern.

In another aspect, the invention relates to a method of fabricating a light system. In various embodiments, the method includes forming multiple electric contacts on a substrate; forming multiple LED dies on the substrate; and interconnecting the LED dies with the electric contacts to form a light-emitting array. In one implementation, at least one of the contacts is embedded in the substrate. The substrate may be made of a semiconductor material and the electric contacts may be at least partially formed by ion implantation.

In various embodiments, the method includes connecting a FET to each of the LED dies. For example, source terminals of the FETs in a row array are connected via the first set of conducting lines, gate terminals of the FETs in a column array are connected via the second set of conducting lines, drain terminals are connected to anodes of associated LED dies, and cathodes of the LED dies are connected to a common ground. Additionally, the method may include selectively activating or deactivating various ones of the LED dies via the associated FETs to achieve a desired pattern.

In some embodiments, the method includes bonding a layer of III-V semiconductor material to the substrate prior to forming the LED dies; the LED dies are formed at least partially within the layer of III-V semiconductor material. In one implementation, forming the LED dies includes (i) forming the LED dies on the second substrate, (ii) removing the LED dies from the second substrate, and (iii) bonding the LED dies to the substrate.

The term "uniform," as used herein, refers to a light intensity distribution whose lower and upper intensity limits are within a factor of four, preferably within a factor of two of each other. As used herein, the terms "approximately," "roughly," and "substantially" mean ±10%, and in some embodiments, ±5%. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

The foregoing will be more readily understood from the following detailed description of the invention, in particular, when taken in conjunction with the drawings, in which:

FIGS. 4A and 4B show the range of beam angles generated with the LED arrangements described in various embodiments;

DETAILED DESCRIPTION

Figure 1A:
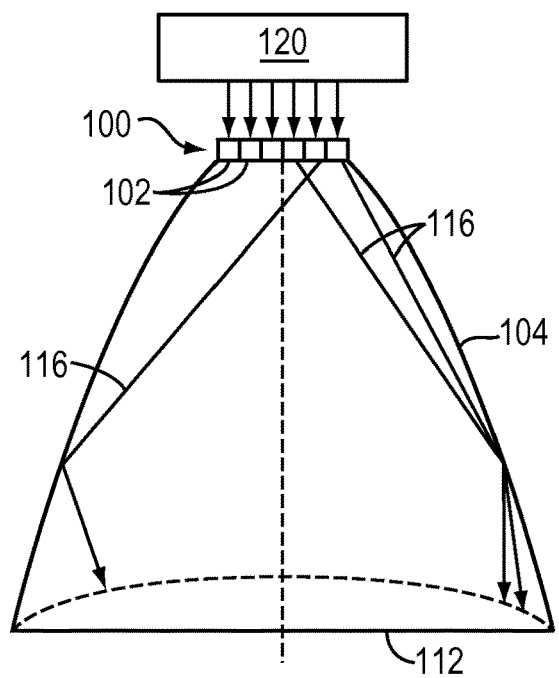
FIG. 1A schematically illustrates the components of a light source in accordance with various embodiments.
Figure 1B:
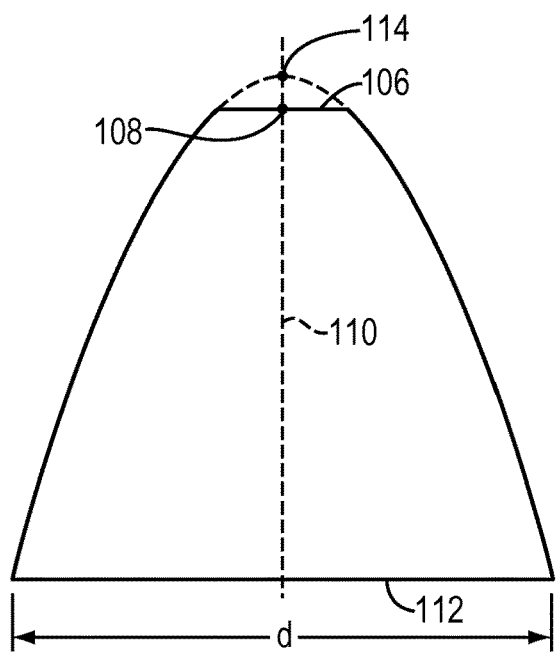
FIG. 1B illustrates various dimensions of the light source of FIG. 1A.

Variable-beam light sources in accordance herewith generally include an arrangement of multiple light-emitting devices disposed, typically, at or near the focus of an optical reflector. FIG. 1A conceptually illustrates an exemplary embodiment that utilizes a planar array 100 of LEDs 102 and a parabolic reflector 104 (i.e., a reflecting optic whose reflective surface forms a truncated paraboloid). The array 100 is placed at the focal plane 106 of the paraboloid (i.e., with reference to FIG. 1B, a plane through the focal point 108 that is perpendicular to the optical axis 110, or symmetry axis, of the paraboloid), and is oriented so as to face in the same direction as the parabolic reflector 104, i.e., such that it emits light towards the aperture 112 of the reflector 104 (corresponding to a cross-section where the paraboloid is truncated), away from the vertex 114 of the paraboloid. Since light emitted from the LED array 102 does not reach the portion of the parabolic surface that lies between the focal plane 106 and the vertex 114, the reflector 104 may also be truncated at the focal plane 106. In TIR embodiments, where the reflector 104 is a solid structure, truncation is generally necessary to place the LED array 100 at the focal plane 106; the paraboloid's cross-section through the focal plane forms, in this case, an entry surface of the optic against which the LED array 100 can be placed. The aperture 112 of the TIR optic constitutes the exit surface.

Figure 1C:
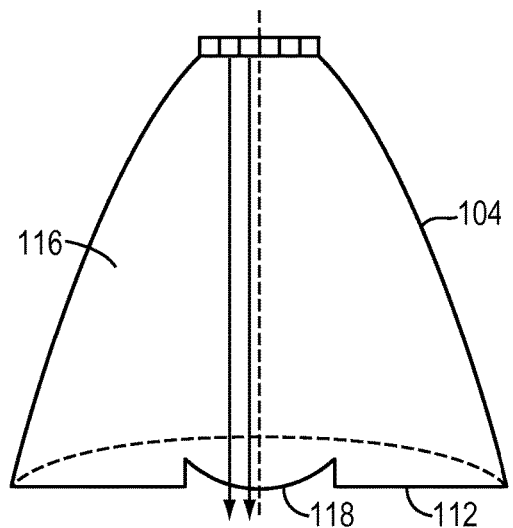
FIG. 1C illustrates a version of the light source of FIG. 1A that includes a TIR optic with a central lens in accordance with various embodiments.

The LED array 100, which is typically (but not necessarily) positioned symmetrically within the reflector 104 such that its center coincides with the optical axis 110, may extend all the way to the surface of the reflector 104, or be of smaller dimensions. Either way, the diameter d of the aperture 112 of the reflector 104 is greater than the largest dimension 1 of the array 100 (e.g., the diameter of a circular arrangement or the diagonal of a rectangular arrangement). In various embodiments, the aperture diameter d exceeds the array size 1 by a factor of at least two, three, or more. Larger ratios are usually desired because, in general, the larger the reflector aperture 112 is compared with the LED array 100, the more of the emitted light is captured by the reflector 104 and the brighter is the reflected beam. As shown in FIG. 1A, light rays 116 from the array 110 that are incident upon the parabolic reflective surface are generally reflected at an angle directing them more towards the optical axis 110. Thus, the light emitted by the array 100 into a large solid angle (e.g., according to a Lambertian distribution, in which the luminous intensity is proportional to the cosine between the observer's line of sight and the optical axis) is partially collimated so as to form a directed output beam. Light that leaves the aperture 112 directly without striking the reflective surface, however, generally retains its large divergence and may, therefore, not (or not significantly) contribute to the output beam. To capture this centrally emitted light, some embodiments include a central lens along the optical axis. For example, a TIR optic as depicted in FIG. 1C may include a collimating lens surface 118 recessed (as shown) or protruding from the exit surface 112. Such a lens surface 118 may result in an increased central beam intensity of the output beam.

In various embodiments hereof, the LEDs 102 are individually addressable, or addressable in multiple groups (each having a plurality of devices), with suitable driver circuitry 120 (shown in FIG. 1A), facilitating their selective activation and de-activation as well as control over the brightness levels of individual LEDs or groups of LEDs via the respective drive currents. Groups of LEDs may be formed by electrically connecting multiple individual LED die such that the LEDs within the group are all driven by the same current (in a series arrangement) or by approximately equal currents (in a parallel arrangement). In some embodiments, each group contains a (typically small) number of LEDs that adjacent or close to each other (e.g., four LEDs arranged in a square). In other embodiments, LEDs are grouped strategically based, e.g., on the LEDs' distance from the center of the arrangement; for example, each group may consist of LEDs arranged approximately in a circle.

Figure 1D:
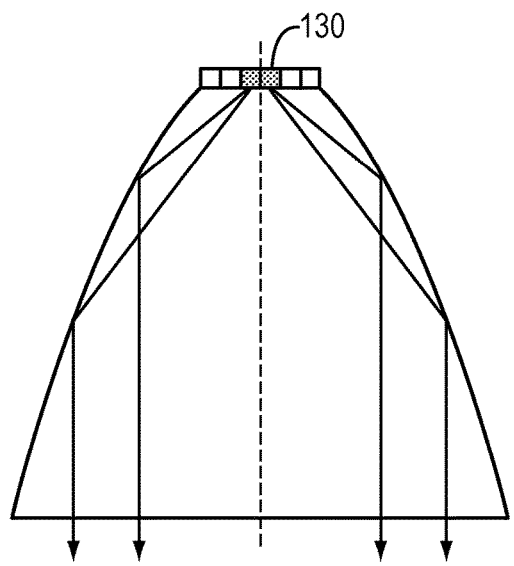
FIGS. 1D and 1E illustrate how narrow and wide beam angles, respectively, can be created by activating fewer or more of the light-emitting devices of the light source of FIG. 1A in accordance with various embodiments.
Figure 1E:
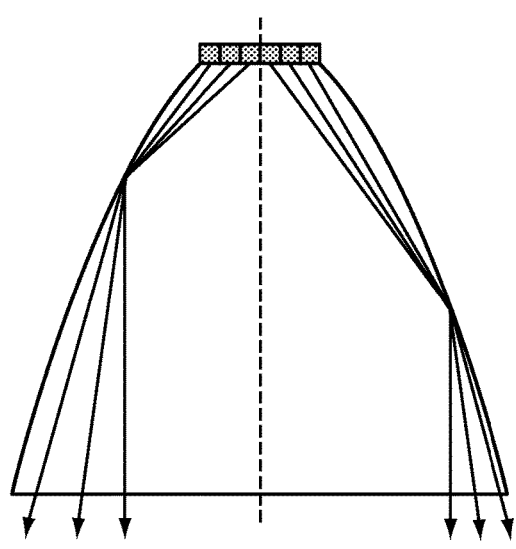

The output beam of such a light source can be varied in divergence angle (which may be defined, e.g., based on the distance from the beam center at which the intensity or the luminous intensity has fallen to 50% of the (luminous) intensity at the center) by driving the individual (groups of) LEDs depending on their distance from the center of the arrangement. The underlying operational principle is illustrated in FIGS. 1D and 1E. As shown, light emitted from the center 130 of the LED array 100 and incident upon the reflector 104 is reflected in a direction parallel to the optical axis 110. Light emitted from off-axis LEDs 102, however, is reflected at an angle relative to the optical axis 110, resulting in divergence of the output beam. The greater the distance of the point of origin within the LED array 100 from the center 130 is, the larger is generally the angle between the reflected ray and the optical axis 110. Consequently, as more and more LEDs 102 are turned on, starting from the center of the array 100—in other words, as the effective size of the array 100 increases—the output-beam divergence likewise increases. For example, with reference to FIG. 1D, if only the two central LEDs of a row of six LEDs (or, for a corresponding two-dimensional LED arrangement, the four central LEDs of a 6×6 array) are turned on, a narrow-angle beam is created. Turning on all six LEDs (or, in the two-dimensional arrangement, all 36 LEDs, i.e., the entire array), by contrast, results in a broader-angle beam, as illustrated in FIG. 1E. The largest beam divergence achievable with a given light source depends on the dimensions of the light-emitting array 100, or, more specifically, the ratio of a linear dimension (e.g., the largest dimension 1, or the width) of the array to the focal length f of the paraboloid, larger ratios typically resulting in greater divergence. In various embodiments, the largest dimension of the array is greater than the focal length, e.g., by a factor of at least two, at least three, or at least four.

Figure 2A:
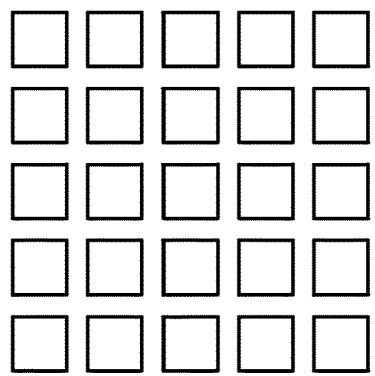
FIGS. 2A-2C illustrate various exemplary arrangements of LEDs in accordance with various embodiments.
Figure 2B:
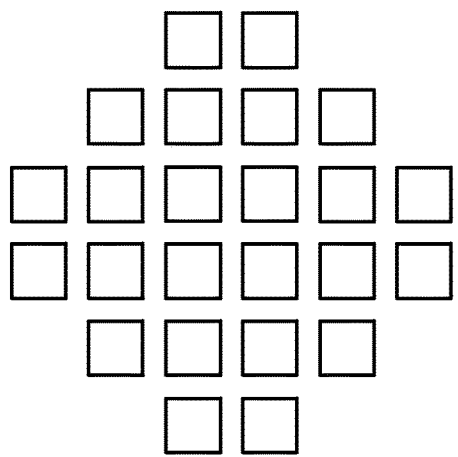
Figure 2C:
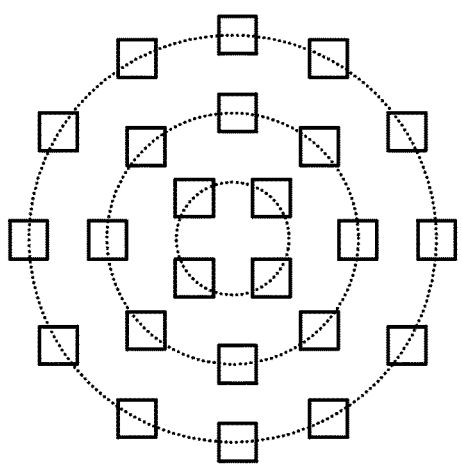

Arrangements of LEDs (or other light-emitting devices) in accordance herewith may vary in shape, size, and configuration. In some embodiments, the LEDs are arranged in a regular array forming a number of rows and columns. The array may be rectangular, as shown in FIG. 2A for 25 LEDs arranged in a 5×5 array, or approximate the typically circular opening of the optic by containing fewer LEDs in the upper and lower rows, as shown in FIG. 2B for a total of 24 LEDs arranged in six rows and six columns. Alternatively, the LEDs may be positioned along concentric circles, as illustrated in FIG. 2C for 24 LEDs, or in any other regular or irregular fashion. The spacing between the arrays may vary depending on the fabrication method employed and the requirements of the particular application. In some embodiments, the individual LEDs have dimensions of 1.1 mm×1.1 mm, and the packaged LED measures about 1.3 mm×1.7 mm Multiple such LED die may be arranged on a substrate or PCB at center-to-center distances of between 1.5 mm and about 2 mm.

Further, the LEDs need not necessarily be placed on a flat substrate, but may be arranged on a curved surface (e.g., a spherical "cap"); not limiting the LEDs to a single plane may provide greater flexibility in tailoring the beam divergence and beam profile as a function of the number (or selection) of LEDs within the arrangement that are activated. For example, an LED arrangement placed with its center at the focus of a parabolic reflector may achieve greater beam divergence, compared with a flat configuration, if it curved convexly when viewed from a direction facing the concave reflective surface of the optic, and a smaller beam divergence if it is curved concavely.

A parabolic reflector generally creates, at long distances (theoretically at infinity), an image of an object located at its focus. Thus, the non-uniformities in the LED arrangement—i.e., the intensity contrast between the LED die and the gaps therebetween—are typically visible in the output beam. Even in theory, however, only a point source at the focus is imaged perfectly; for an extended light-emitting structure, such as the LED arrangement, the images of the individual LEDs generally overlap (due to the beam divergence), blurring their boundaries. In many applications, this effect is desirable, as it results in greater uniformity of the beam. The effect may be further enhanced by faceting the reflector, i.e., by approximating the curved reflective surface with multiple (usually planar) segments. Typically (but not necessarily), the optic is faceted in two dimensions: vertically, i.e., along the (parabolic) intersections of planes through the optical axis with the paraboloid, and azimuthally, i.e., along the (circular) intersections of planes perpendicular to the optical axis with the paraboloid, resulting in multiple planar quadrilateral segments whose corners lie on the paraboloid. Each facet creates a divergent beam even for light originating directly from the focus; the overlap of the individual divergent beams from all the facets may result in relatively uniform illumination. In TIR optics with central lenses, the lens surface may likewise be faceted or, alternatively, textured at smaller scales. Faceted and/or textured optics are particularly useful with LED arrays that have a dark spot at the center, resulting from the intersection of the vertical and horizontal gaps between adjacent columns and rows of LEDs; without faceting, this dark spot would result in an undesirable hole in the center of the output beam. Faceted optics and the resulting beam characteristics are described in more detail in U.S. patent application Ser. No. 13/606,106, filed on Sep. 7, 2012, the entire disclosure of which is hereby incorporated herein by reference.

Figure 3A:
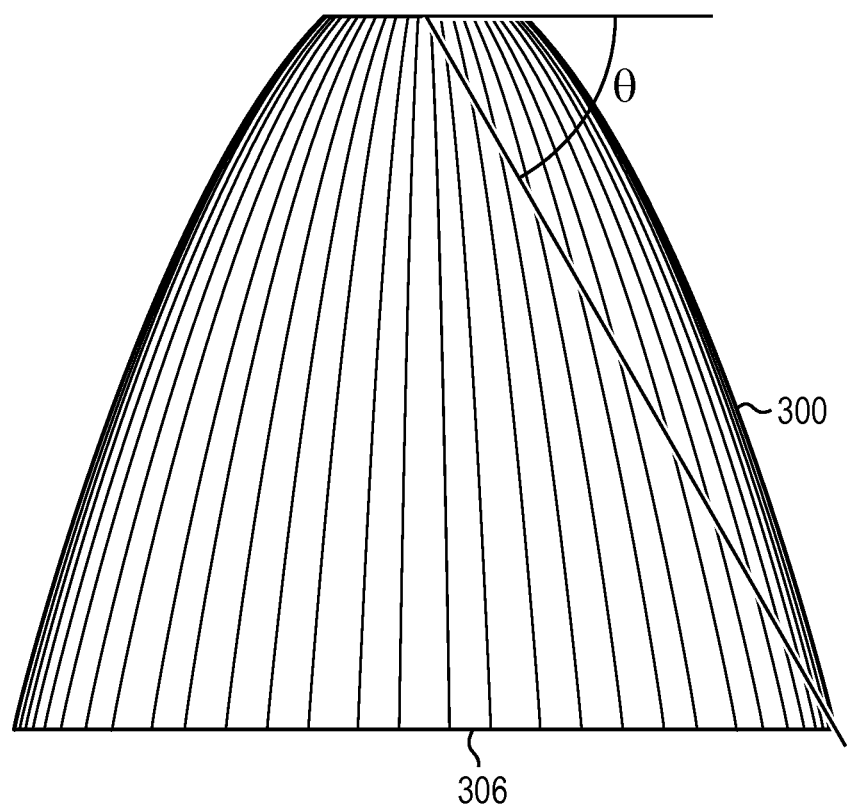
FIGS. 3A and 3B illustrate a faceted parabolic reflector in accordance with various embodiments.
Figure 3B:
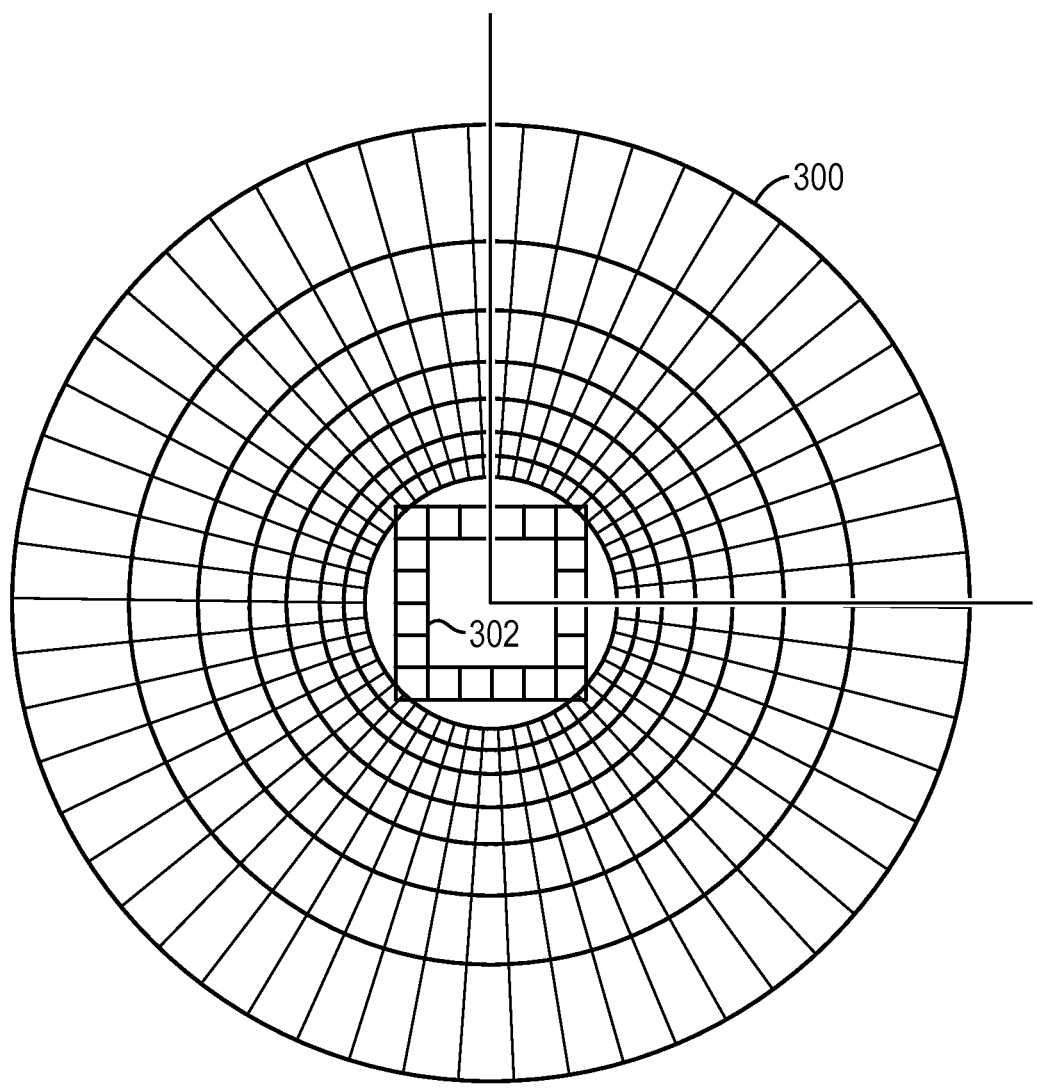
Figure 3C:
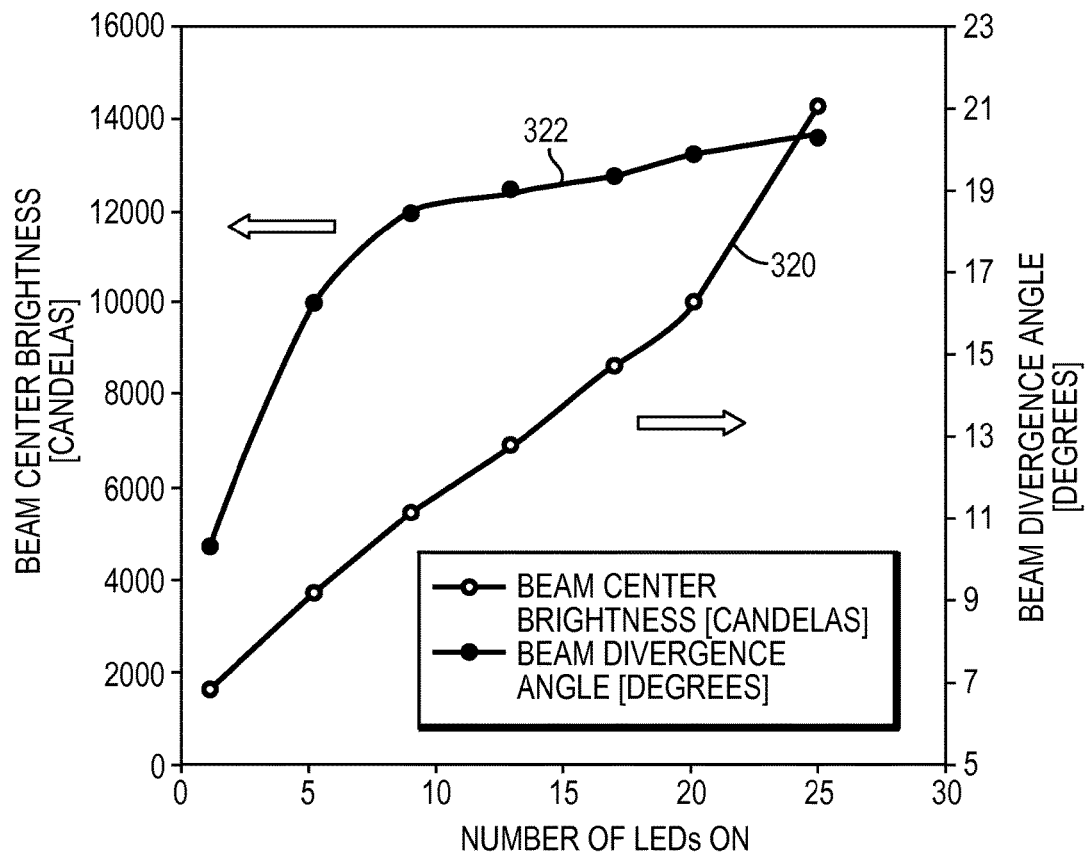
FIG. 3C shows, for the reflector of FIGS. 3A and 3B, plots of the computed center-beam brightness and divergence angle of the output beam as a function of the number of activated LEDs in accordance with various embodiments.

FIGS. 3A-3C quantitatively characterize one embodiment of a variable-beam light source based on computational modeling. The modeled light source includes a 5×5 LED array of Luxeon Z LEDs, placed at the focal plane of a faceted parabolic reflector. FIG. 3A shows a side view of the reflector 300, and FIG. 3B shows a top view of the reflector along with the 5×5 array of LEDs 302. The angular extent of the reflector 300, measured, in a cross-section through the optical axis, as the opening angle θ between a straight line in the focal plane and a straight line connecting the focus with the edge of the reflector's aperture 304, is 70°. The reflector 300 has an opening 306 with a diameter of 1 cm at the entrance surface (where the LEDs are located). Vertical facets each subtend 10°, and azimuthal facets each occupy 6.666° (such that a total of 54 facets cover the full 360° circle). The resulting reflector has a height of 3.2 cm and a radius of 1.85 cm.

In a series of calculations, the LEDs were turned off from the outside one by one, and the resulting divergence angle and candela value at the center of the beam (which is a measure of brightness at the center of the beam) were calculated. The results of these calculations are shown in FIG. 3C. The lower curve 320, representing the divergence angle of the beam (right axis), shows that, as the outer LEDs are turned off, the beam angle monotonically decreases from about 21° down to 7°, where only one LED remains lit. As the individual LEDs are turned off successively, the total light output decreases linearly (not shown) since each LED generates, in this model, 100 lumens. However, as can be seen in the upper curve 322, the beam brightness at the center (left axis) remains nearly constant in the range from twenty five LEDs down to about five LEDs, indicating that the bulk of the light is being withdrawn from the outside of the light beam. Thus, from the user's perspective, the object being illuminated remains at about the same brightness while the surrounding region becomes darker.

With reference to FIG. 4A, the maximum ratio of the wide beam angle to narrow beam angle (or the range of beam angles) of the LED arrangement depicted in FIG. 2C is approximately 3:1. The range of beam angles decreases as the design angle of the reflector 104 is reduced. As used herein, the "design angle" refers to the portion of the forward-facing 2π steradian region that the reflector 104 occupies. Because the reflector is circularly symmetric, the design angle is measured in degrees from the plane of the LED array 100. Thus, a line perpendicular to this plane, e.g., the optical axis 110 has a design angle of −90°. For the 24 LED light source with the parabolic reflector 104 having a design angle of −30° and a radius aperture of 6 mm to accommodate the LED array 100, the divergence angle thereof ranges roughly from 12° to 29°. FIG. 4A shows that the range of the divergence angles decreases when a reflector having a smaller design angle (e.g., −50°) is implemented.

In one embodiment, a larger range of beam angles is achieved by increasing the emitting surface area of the LED array 100 (e.g., increasing the number of the LED dies 102 and/or enlarging the size of each LED 102) and the aperture radius of the reflector 104 to accommodate the LED array 100. For example, referring to FIG. 4B, when the aperture radius of the reflector 104 having a design angle of −50° increases from 6 mm to 12 mm and the number of LEDs increases in proportion to the increased area while the individual LED size remains the same, the range of beam angles also increases by approximately a factor of two (from 1:2.1 to 1:4.6). Note that the Center Beam Candelas (CBCd), a measure of the brightness of the center beam (i.e., at an orientation angle of −90°) is not significantly affected by reducing the number of activated LEDs from 88 to 4, consistent with the computational modeling illustrated in FIG. 3C.

Figure 5A:
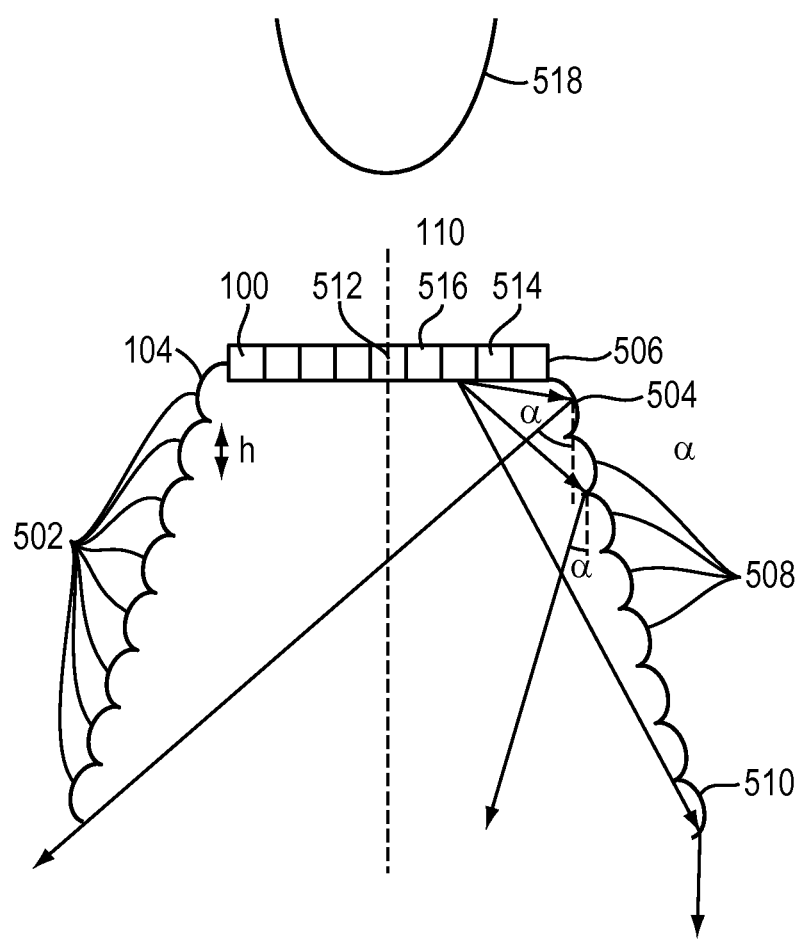
FIGS. 5A and 5B depict reflectors having multiple segments for enhancing the divergence angle of the output beam in accordance with various embodiments.
Figures 5B, 5C:
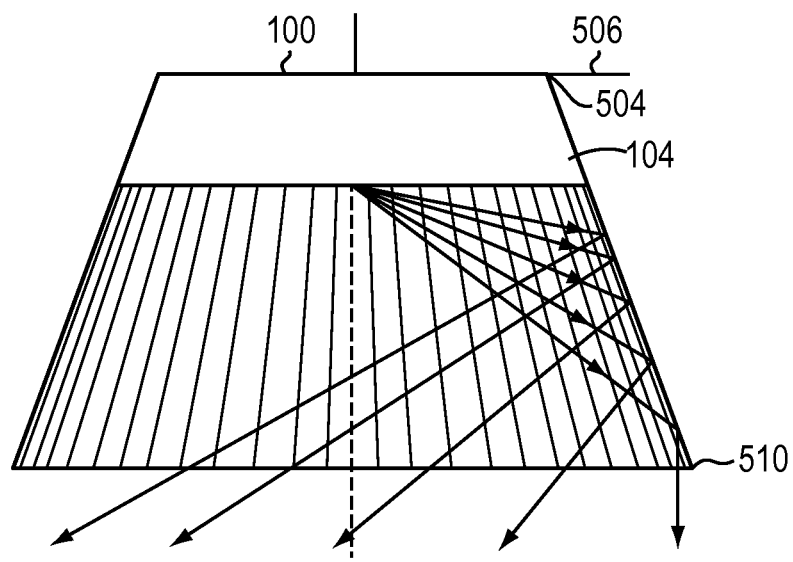
FIG. 5C illustrates the range of beam angles and center beam candelas generated with the LED arrangements of FIGS. 5A and 5B.

Although the range of beam angles positively correlates with the entrance size of the reflector 104, and a reflector 104 with a larger aperture radius may be utilized to accommodate more LEDs to further increase the range of beam angles, this results in an increased number of LEDs spread out over a larger area and may cause difficulty in wiring the LEDs or may generate excessive heat. In various embodiments, an alternative or further enhancement of the range of beam angles is achieved by modifying the reflector 104 without changing the dimensions of the LED array 100. Referring to FIG. 5A, in a preferable embodiment, the reflector 104 is constructed from a series of parabolic segments 502; the segments 502 may overlap and nest, one inside the other. Each segment preferably has a finite and different parabola height h (e.g., a conic section) to direct light emitted thereon at a different aiming angle α with respect to the axis of symmetry 110, thereby creating a controlled beam divergence. For example, the reflector segment 504 closest to the plane 506 of the LED array 100 has the most divergent parabola (i.e., it reflects light emitted from the LED array 100 at the largest angle relative to the optical axis 110 of the paraboloid); the successive segments 508 of the parabolic reflector 104 have lower divergences, and finally the segment 510 that is farthest away from the LED plane 506 redirects the light to form a collimated beam (i.e., at an orientation angle of −90°). FIG. 5B illustrates a parabolic reflector 104 having a graded aiming angle α to direct the light emitted by the LED array 100 at a range of angles as described above. The aiming angles of the segments 502 in this design decrease linearly from −90° (directed by the segment 510, farthest from the LED plane 506) to an angle (e.g., −35°) approximately equal to the desired widest beam angle (directed by the segment 504, closest to the LED plane 506). The maximum aiming angle of the segment 504 may not not exceed the desired wide beam angle because too wide an angle can result in light striking the reflector 104 multiple times and reducing the overall efficiency.

Referring again to FIG. 5A, the amount of light emitted by each LED onto the segments 502 depends on the distance between the individual LED and the center 512 of the LED array. For example, a greater distance between an off-axis LED 514 and the center 512 of the LED array 100 results in a greater amount of light striking the reflector 104 from the off-axis LED 102 (due to the Lambertian distribution), whereas relative little light emitted from an LED 516 near the array center 512 encounters the reflector. As a result, the segment 504 closest to the LED plane 506 may direct a larger amount of light emitted from LEDs 514 more distant from the array center 512 in order to create a more divergent beam, thereby increasing the divergence angle of the wide beam. Referring to FIG. 5C, as LEDs are turned on from the center 512 (which generates the narrow beam) to the edge of the array (which generates the wide beam), the current invention enhances the range of the beam angles to 1:6.2 by allowing the reflector 104 to separately "address" each region of the LED array. In addition, the LED array 100 may be arranged as shown in FIGS. 2A-2C such that the number of LEDs increases as the distance between the off-axis LED 514 and array center 512 (or off-axis distance) increases. Because this design provides more LED emitted light to the reflector segments closer to LED plane 512 (due to more off-axis LEDs) than to segments farther from the LED plane 512, the divergence beam angle may, again, be increased.

Figures 5D, 5E:
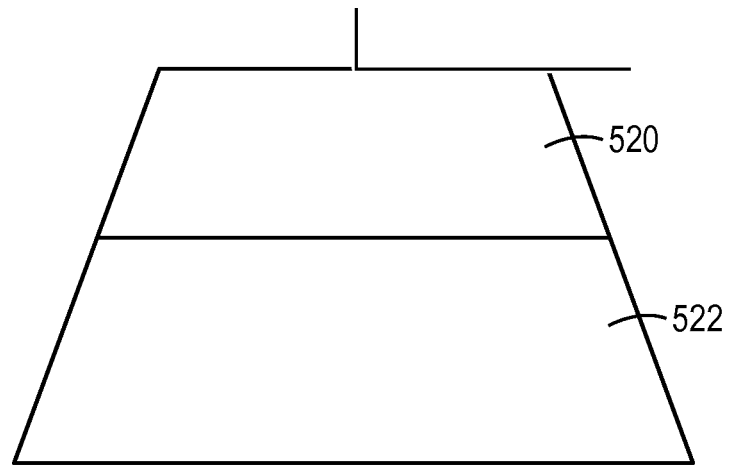
FIG. 5D depicts a dual reflector utilized for providing a large beam divergence and enhancing the center beam intensity in accordance with various embodiments.
FIG. 5E illustrates the range of beam angles and center beam candelas generated with the LED arrangement of FIG. 5D.

As shown in FIG. 5C, the overall center beam candela value using this design may decrease compared with the result of using a single segment reflector (i.e., from 1:1.35 to 1:5.5), and the center beam intensity may be improved by constructing the reflector segments 502 to enhance the collimated portion of the beam. Although this approach may sacrifice the divergence angle of the wide beam, a satisfactory intensity of the center beam as well as a desired range of beam angles may be achieved by finely "tuning" the profiles of the reflector segments 502. For example, referring to FIG. 5D, in some embodiments, the reflector is divided into two regions 520, 522. The region 520 includes multiple segments having graded aiming angles ranging from −50° to −90° in the manner described above for increasing the range of the beam angles. By contrast, the region 522 includes one segment having an aiming angle of −90° for collimating beams and thereby enhancing the intensity of the center beam at all angles (which is particularly important when only the centrally located LEDs are activated). FIG. 5E illustrates how the dual-reflector design sacrifices part of the divergence angle but effectively enhances the center beam intensity at both narrow and wide beam settings (compared with the single-section reflector design in FIGS. 5B and 5C) due to a greater portion of the reflector surface being devoted to collimation of the beam.

Additionally, the central beam brightness at narrow angles may be further increased by "forcing" the light to strike the reflector 104. As mentioned above, the central brightness falls off because of the Lambertian distribution—i.e., most of the light is directed at the angle of −90° and misses the reflector 104. Thus, referring again to FIG. 5A, in one implementation, a "side-emitting" optic 518 having, for example, the shape of an inverted cone (i.e., vertex down) is placed over the centrally located LED array 100 to deflect the light directly to the outer reflector, thereby increasing the intensity of the central beam.

Figure 6A:
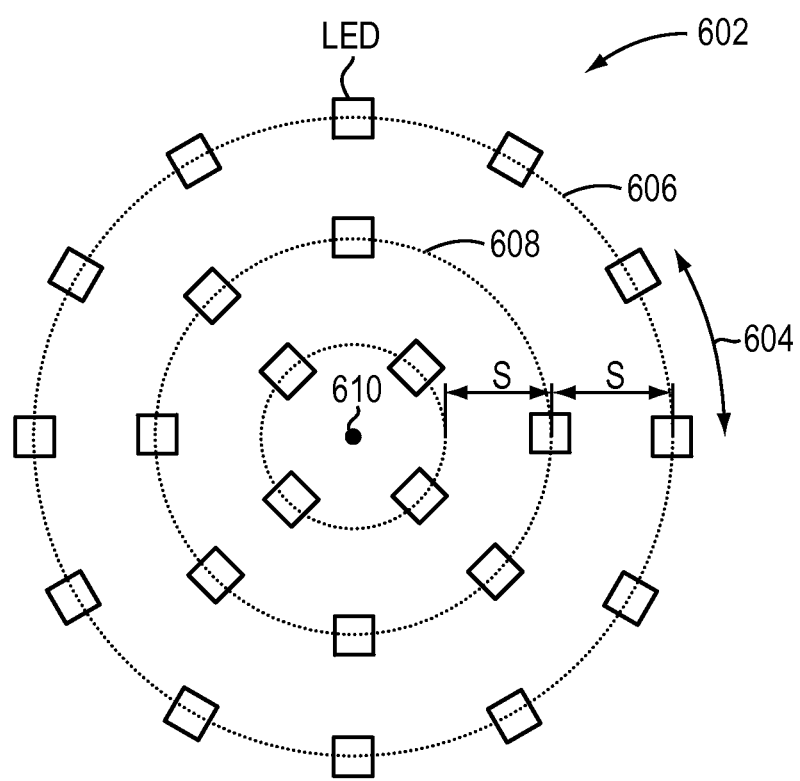
FIG. 6A depicts an LED arrangement in accordance with various embodiments.

Generally, the symmetry of the LED layout (e.g., a rectangular or circular symmetry) in conjunction with that of the optic may disadvantageously yield an undesirable light pattern. On the other hand, the uniformity in emission intensity is important for developing a Lambertian distribution of the output light. To achieve a near-true Lambertian light distribution without creating visible undesirable patterns, the LED arrangement may be approximately uniform (i.e., the area density of the LEDs is uniform) to create the uniform area density of light and provide a Lambertian distribution of the output light. Referring to FIG. 6A, for example, the layout of the LEDs may have a circular symmetry—i.e., including a series of concentric rings 602 of LEDs, with a constant inter-ring spacing s. In one embodiment, the spacing 604 between LEDs along a circumference 606 is the same and the successive radii of the rings 602 each differ by the distance of LED separation along their circumference such that the LEDs lie in approximately a uniform area distribution. An advantage to this design is that, because of the uniformity of the center beam, it is unnecessary to have a dense pattern of LEDs to achieve beam uniformity. As a result, wiring the LEDs is easier since they can be spaced relatively far apart and the LED array can be easily mounted on traditional PCBs or created using a semiconductor fabrication process.

Figure 6B:
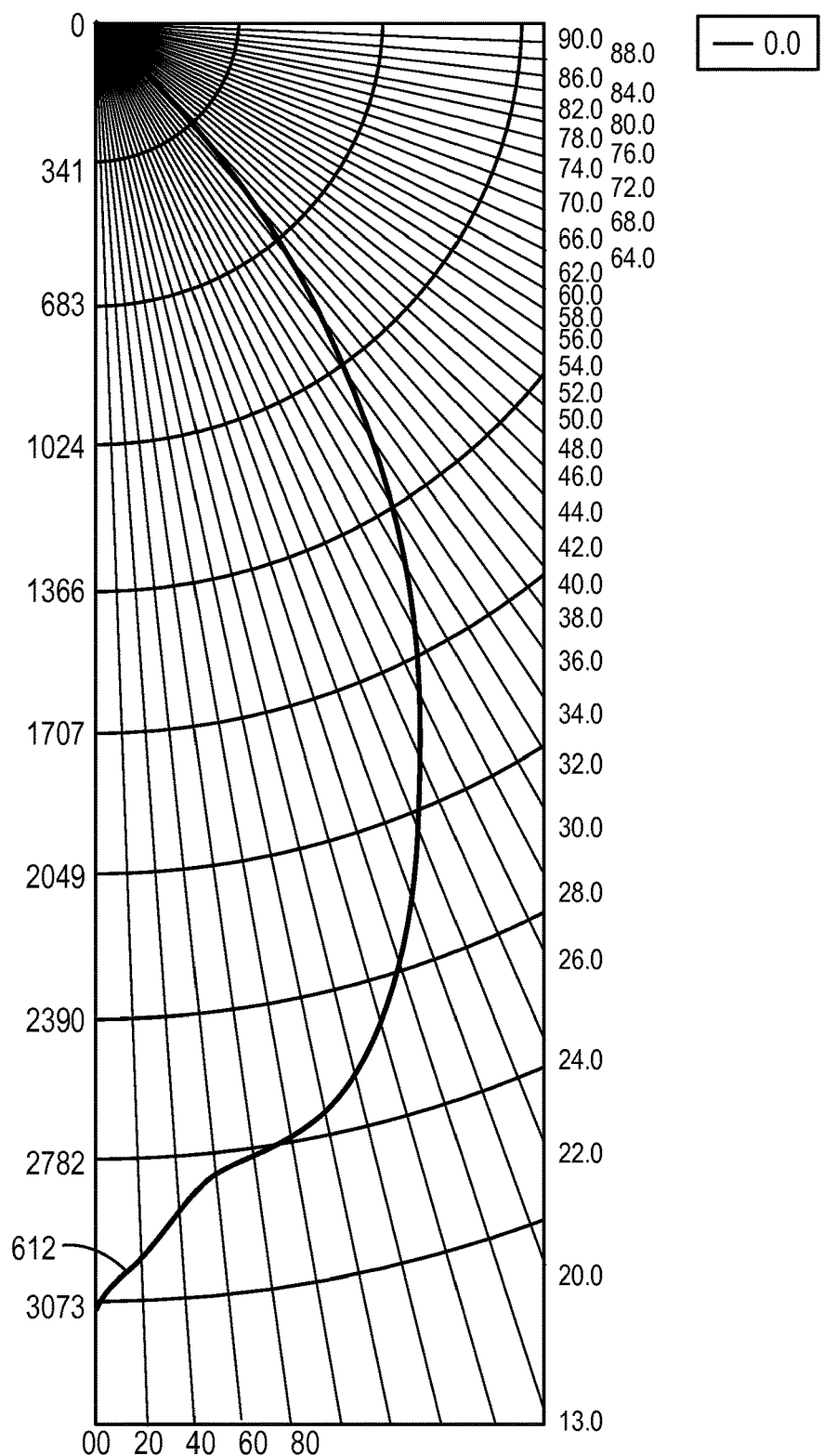
FIGS. 6B and 6C illustrate light distributions when a center LED is present and absent, respectively, in the LED array.
Figure 6C:
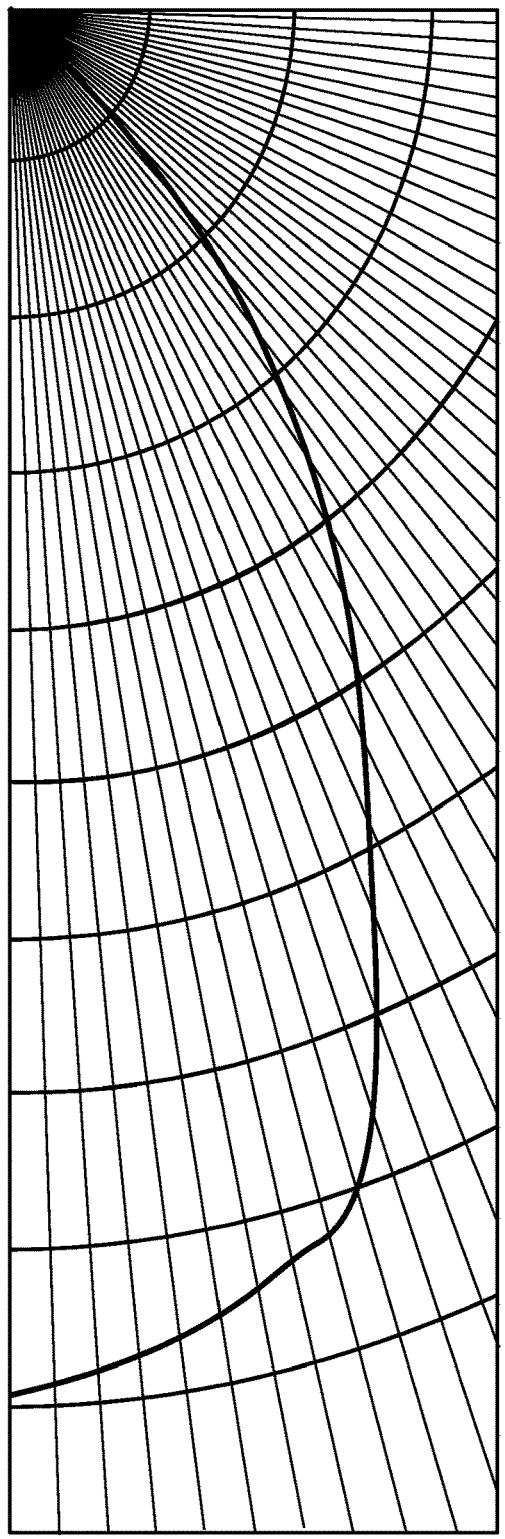
Figure 6D:
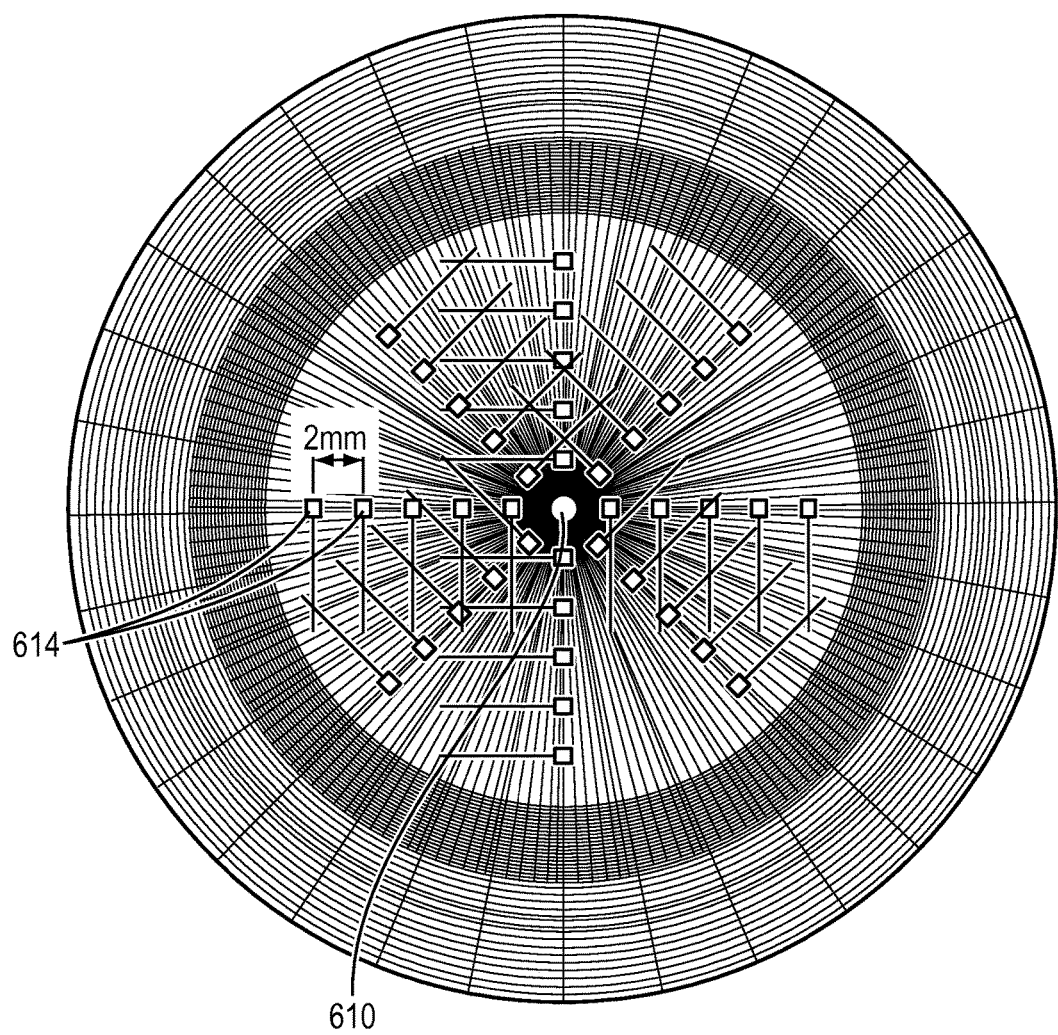
FIG. 6D depicts an LED arrangement in accordance with various embodiments.
Figure 6E:
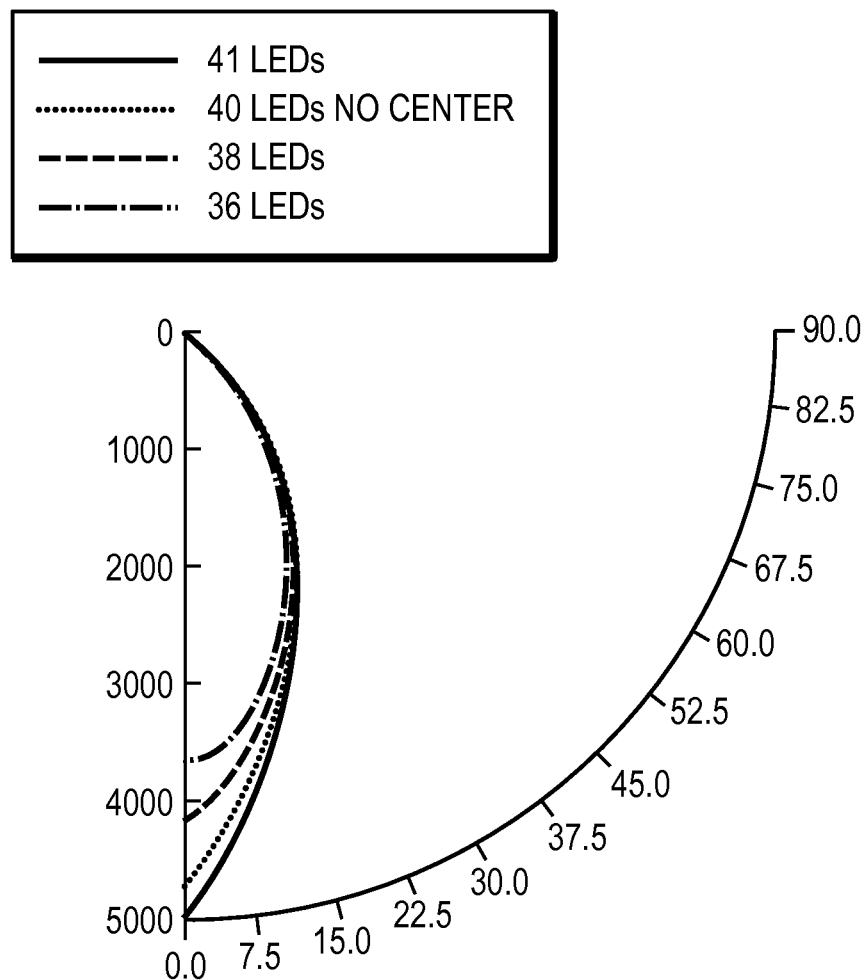
FIG. 6E illustrates light distributions generated with the LED arrangement of FIG. 6D.

In this design, an LED located at the center 610 of the rings 602 may be detrimental to the shape of the resulting output beam. Referring to FIG. 6B, when an LED die is placed at the center 610, a sharp point 612 is created and thus results in a significant deviation from the desired Lambertian distribution. FIG. 6C, by contrast, shows an output beam with a reasonably good Lambertian distribution when no LED is placed at the center 610. Because the reflector 104 is itself circularly symmetric, the symmetrical arrangement of the LED layout may not create undesired effects on the light beam. However, the arrangement of LEDs should not retain excessive symmetry. For example, if the LEDs lie along the circumferences to create circular symmetry, and also lie along radial lines to create a radial symmetry, the compound symmetry may lead to brighter "rings" than the surrounding field of emission. FIG. 6D depicts an LED arrangement in which the LEDs 614 are placed along radial lines with a spacing of 2 mm; this results in a decreased spacing between the LEDs along a circumference as the distance from the center 610 increases. Because the density of light is highest at the center region and the area density decreases from the center to the edge, the output beam is a distinctly non-Lambertian light pattern as depicted in FIG. 6E. To achieve a Lambertian distribution, it may be necessary to disrupt the circular symmetry of the concentric rings of LEDs by either varying the inter-ring distance (i.e., altering the relative positions of the LED rings themselves) or shifting one or more of the radial rows of LEDs toward the center 610 while shifting one or more other rows away from the center 610. Alternatively, the bright ring pattern may be avoided by destroying the radial symmetry by shifting the LEDs of one ring along the circumference in a clockwise direction and shifting the LEDs of another ring along the circumference in a counter-clockwise direction.

Alternatively, the Lambertian distribution may be generated as the number density of LEDs at the center decreases. For example, FIG. 6E illustrates that when the total number of LEDs is reduced from 41 to 36 LEDs, the distribution is Lambertian. This is because the LED at the center 610 lies at the focal point of the roughly parabolic reflectors and thus has an inordinate effect on the brightness of the central beam. Additionally, by removing the center LED, the beam angle can be increased since the beam angle is taken at the value where the intensity is half maximum intensity on either side of the optical axis.

Although reducing the density of the LEDs at the center region 610 may produce a wide divergence angle, it is desirable to have the center LEDs when a narrow angle light distribution is required. In various embodiments, the driver circuitry 120 is configured to adjust the power level of the LEDs located near the center 610 to be different from those located near the outer circumference. For example, the center LEDs may have a lower intensity (or be completely turned off) to produce a wide beam while they may have a higher intensity when a narrow beam is desired.

Arrangements of LEDs that addressable individually of in groups, for use in embodiments hereof, may be fabricated in various ways. In some embodiments, the LED arrangement is formed of a plurality of so-called "flip-chip" LEDs, which, advantageously, enable the package used to hold the semiconductor die to be reduced to little more than the size of the die itself. These LEDs, in which the electrical contacts are all on one surface of the semiconductor die, eliminate the gold bond wires that take up valuable "real estate" surrounding the die itself, and thus require a larger package, in older types of LEDs. Because the package is a significant contributor to the overall cost of an LED, flip-chip LEDs also help to reduce cost. An example of a commercially available flip-chip product is Philips Lumileds Luxeon Z (from Philips Lumileds Lighting Company), in which the die and package are nearly identical in size and occupy an area of only 2.2 mm$^2$. These packaged LEDs have electrical contacts on the back, and can, as a result, be placed very close together. Despite their small size, they produce a considerable amount of light, with each die capable of in excess of 100 lumens. The flip-chip LEDs may be soldered onto a conventional printed circuit board (PCB) that provides the driver circuitry 120 for addressing the individual LEDs (or groups of LEDs); the PCB may be fabricated, e.g., using conventional silk-screen patterning technology as is well-known to persons of skill in the art.

Figure 7:
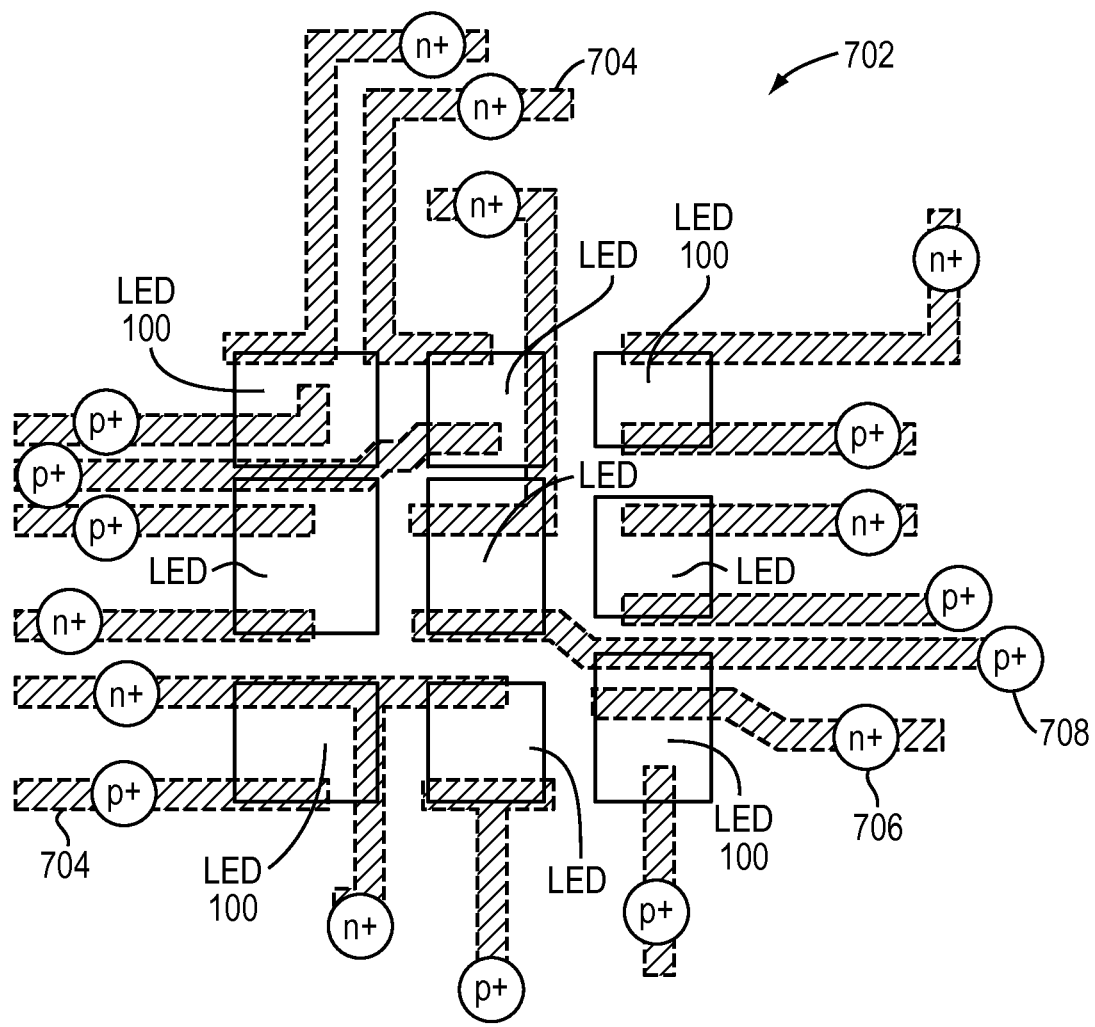
FIG. 7 conceptually illustrates an exemplary embodiment, in which an LED array is disposed on a single substrate in accordance with various embodiments.

Alternatively, referring to FIG. 7, in some embodiments, the LED array 100 is disposed on a single substrate 702 made of, for example, silicon. In various embodiments, electronic components 120, such as LED driver circuitry and/or support circuitry, are fabricated in situ with the LEDs 100; this enables the entire device to be fabricated on the same silicon substrate 702. Because the LEDs 100 and driver/support circuitry 120 on the silicon substrate 702 may be fabricated using, for example, semiconductor photolithography techniques, high-resolution LED packing may be achieved without the spatial limitations present in a PCB-based approach.

In some embodiments, the LEDs 100 are formed of a compound, e.g., group III-V based (e.g., GaN, or GaInP) semiconductor material; the semiconductor material may be first bonded to the substrate 702 and subsequently processed to form the LED dies. Alternatively, the individual LED dies may be formed separately and subsequently bonded to the substrate 702. The substrate 702 may include one or more doped layers 704 embedded therein to form n-type contacts 706 and p-type contacts 708. In one embodiment, the embedded doped layer(s) 704 are fabricated by, for example, (1) ion implantation of one or more dopant species into the silicon wafer followed by annealing, or (2) chemical vapor deposition of the doped layer(s) followed by deposition of an insulating or counter-doped layer to form the complete embedded doped layer(s) 704. Vias (not shown) connecting the LEDs 100 to the n-type and p-type contacts 706, 708 may be fabricated using well-established silicon fabrication methods (e.g., through-silicon vias formed by etching of the silicon material and deposition of a metallic or other conductive layer into the etched regions).

Figure 8:
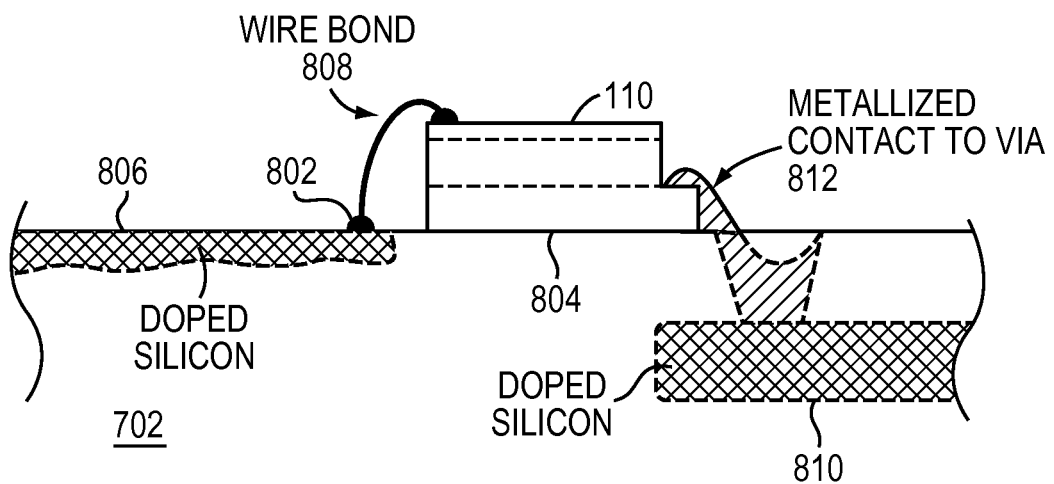
FIG. 8 depicts a schematic cross-section view of an LED die bonded to the substrate in accordance with various embodiments.

In some embodiments, the LEDs 100 are formed utilizing III-V semiconductor material that has been bonded to the substrate 702 in order to avoid potential problems (e.g., dopant contamination or interface defects between the LEDs 100 and the substrate 702) that may result from depositing the group III-V based compound on the silicon wafer. The III-V material may be bonded to the substrate 702 prior to LED fabrication, or the III-V-based LEDs may be fabricated on an alternative substrate and then bonded to the final substrate. Referring to FIG. 8, in one implementation, the group III-V based LEDs 110 are first prepared on a highly resistive substrate (e.g., sapphire, SiC or GaN) in a separate reactor and subsequently metallized to form individual anode and cathode contacts thereon. To accommodate the pre-formed LED dies, the silicon substrate 702 may be patterned to form metallized pads 802 thereon. The prepared LED dies 100 may then be placed onto (or near) metallized pads 802 on the silicon wafer 702. In one implementation, an adhesive 804 is used to fix the positions of the LED dies 100.

Referring again to FIG. 8, the anode and cathode contacts of each LED may connect to the p-type and n-type doped contacts, respectively. For example, if the doped contact 806 is on the wafer surface, a fine wire 808 may be used to create contacts between the LED 110 and the substrate 702. If, however, the doped contact 810 is embedded in the silicon, the LED die 110 may be heated to the melting point of the metallization to form a metallized contact 812 with the via that connects to the embedded doped contact 810. Again, because photolithography may place the doped contacts 806, 810 and conducting traces connected thereto with a high resolution, using a silicon wafer as the LED substrate 702 provides highly compact LED packing. Additionally, because the conducting lines and/or the driver/support circuitry 120 may lie on or within the silicon wafer, the semiconductor substrate 702 also advantageously reduces surface requirements of the substrate for the LED driver/support circuitry 120, which ultimately results in efficient LED packing. This may consequently reduce the need for using textured/faceted optics to control uniformity and/or angles of LED beams.

Figure 9A:
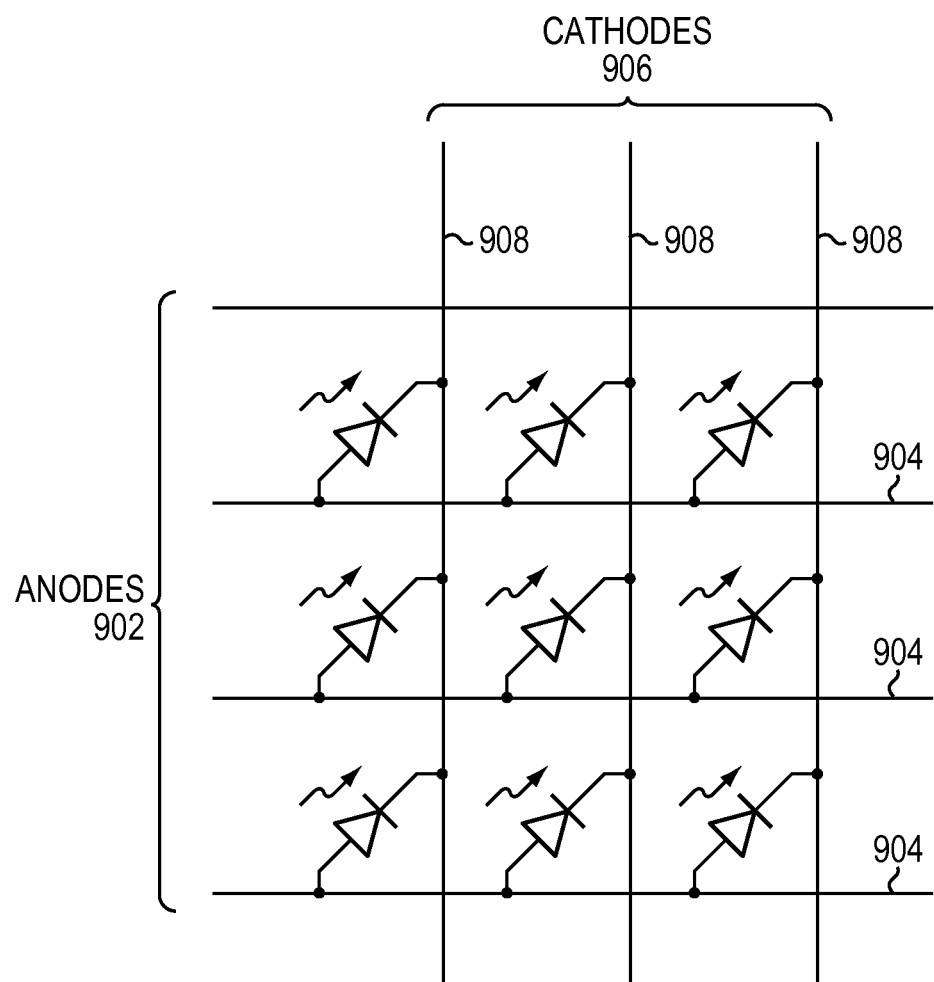
FIG. 9A depicts an exemplary embodiment where the semiconductor substrate may provide additional flexibility in addressing the LEDs individually or in a small group in accordance with various embodiments.
Figure 9B:
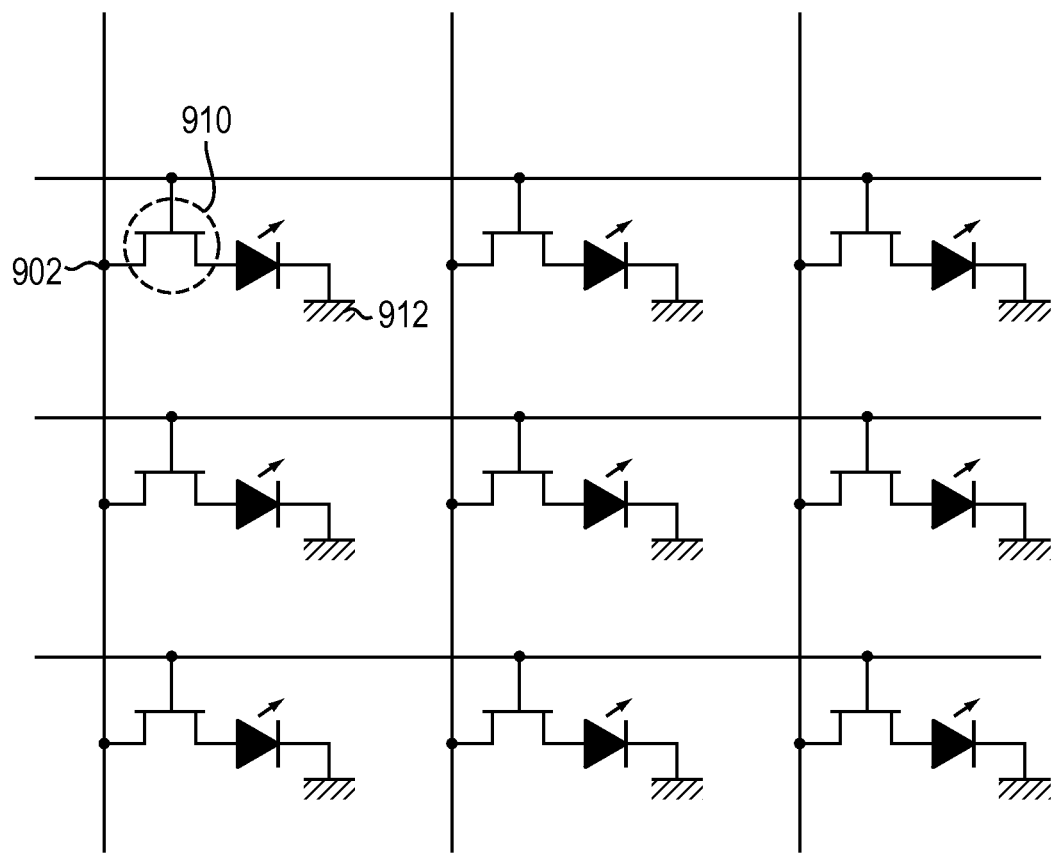
FIG. 9B illustrates an FET-based circuit integrated with LEDs that are connected to a common ground plane in accordance with various embodiments.

The semiconductor substrate 702 may provide additional flexibility in addressing the LEDs 100 individually or in a small group. FIG. 9A depicts an exemplary embodiment. In particular, anodes 902 of the LEDs 110 in a row array may share one set of conducting lines 904 while cathodes 906 of the LEDs 110 in a column array may share another set of the conducting lines 908. The LEDs 110 may thus be individually addressable using the conducting lines 904, 908 with suitable driver circuitry to facilitate their selective activation and de-activation. For example, the LEDs 110 may be powered and driven using a pulse-width modulation (PWM) approach; as a result, the LEDs 110 may be activated with various durations to achieve desired effects. In one embodiment, the row-wise and column-wise addressing are synchronized with the PWM signals. If variations in the LED current occur during individual addressing (e.g., due to the LEDs that are effectively connected in parallel), a more highly selective control method may be used to regulate the current levels. In one embodiment, this is achieved by employing a field-effect transistor (FET) 910 at the node 902 corresponding to each LED as depicted in FIG. 9B. In particular, FIG. 9B illustrates an FET-based circuit integrated with LEDs that are connected to a common ground plane 912. In some embodiments, the MT 910 is embedded in the silicon wafer and acts as a switch to provide additional flexibility in the LED addressing scheme. For example, the source and gate terminals of the MT may be connected to the row-wise and column-wise doped layers embedded in the silicon wafer, respectively, while the drain gate thereof is connected to the associated LED. Because integrating circuitry on a silicon wafer is a mature technique, such implementations can be easily and economically manufactured.

Figure 10:
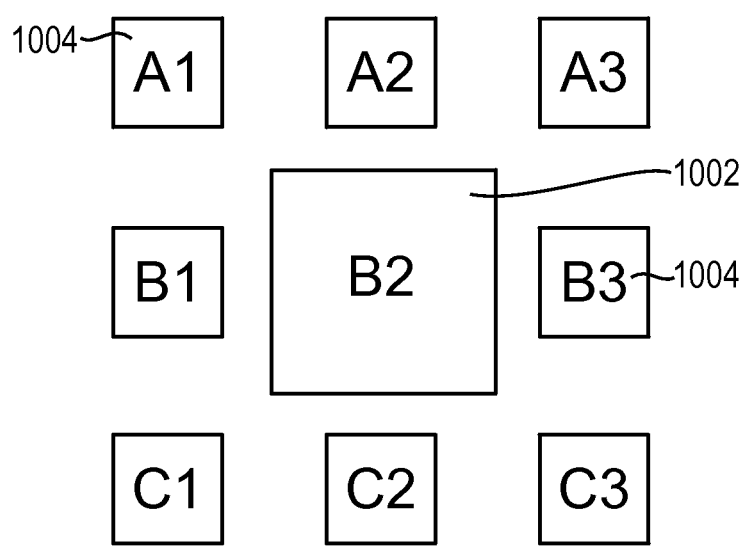
FIG. 10 depicts an exemplary embodiment where the LED array is composed of identical LEDs or different types of LEDs in accordance with various embodiments.

The LED arrays 100 may be composed of identical LEDs or different types of LEDs, including LEDs of different sizes, power, brightness, or color. The particular selection and arrangement of LEDs may be tailored to specific applications and desired beam profiles and dependencies on beam angle. For example, referring to FIG. 10, a larger LED die 1002 may be desirable in the center of the LED array for enhancing center beam brightness while small dies 1004 surrounding the center die 1002 may be used to widen the beam angle and lower the drive current for reducing the heat density generated from the overall LED array 110. This design may be implemented in, for example, portable devices (e.g., flashlights) which first emit a narrow but very bright beam by activating the center LED die and smoothly transition to a bright, wide-floodlight type beam as the surrounding LED dies are activated. The overall power consumption and heat dissipation may remain constant as the beam angle is adjusted. Alternatively, each LED die may consume the same amount of power and the power and beam angle may be tracked and controlled together to optimize the performance during operation.

In some embodiments, the LED array 110 includes multiple sets of colored LEDs. With such arrays, white light may be created by using optics to cause mixing of the light. Furthermore, by using differently colored LEDs (such as red, green, blue, and yellow LEDs) and powering them so as to create different light outputs of each color and then mixing the colors, a broad range of colors may be created for decorative effects. Additionally, the LED driver circuitry may address the LEDs in a programmable fashion. The driver may be provided with a set of standard programs, and/or facilitate programming by the user. Again, in some embodiments, faceted/textured optics as described above are used in conjunction with the LED array 110 fabricated on a single substrate for providing uniformity and wide illumination angles of the beams.

In addition to the advantages of photolithography, which results in effectively close-packed LEDs, and flexibility of controlling individually addressable LEDs, using the semiconductor substrate provides an additional benefit of efficiently dissipating the heat generated during operation of the LEDs. This is because single-crystal silicon has a high thermal conductivity (approximately 1.48 W/cm-K), which is comparable to that of a metal (for example, aluminum has a thermal conductivity of 2.37 W/cm-K). Efficient heat dissipation is particularly critical in close-packed LEDs; this is because the heat density generated by the LEDs and their driver/support circuitry is very high during operation and it is generally challenging to efficiently dissipate the heat quickly enough to prevent an excessive rise in LED temperature. Failure to dissipate the heat efficiently typically results in an LED failure or a lifetime drop. Accordingly, substrates made of silicon may provide a good alternative for solving this problem.

Although discussions herein focus on advantages of depositing an LED array on a substrate made of a semiconductor material, the current invention is not limited to semiconductor substrates. For example, ceramic or other insulating material capable of providing a smooth surface may be finished as a substrate for supporting the LEDs. Again, photolithography may be used to define fine conducting lines that address each LED (or each group of LEDs); LEDs are then placed near the metallized contacts on the substrate. Connections between the LEDs and the contacts may then be subsequently made. This procedure, again, provides high-resolution LED packing with flexibility of addressing the LEDs individually (or in groups).

Figure 11:
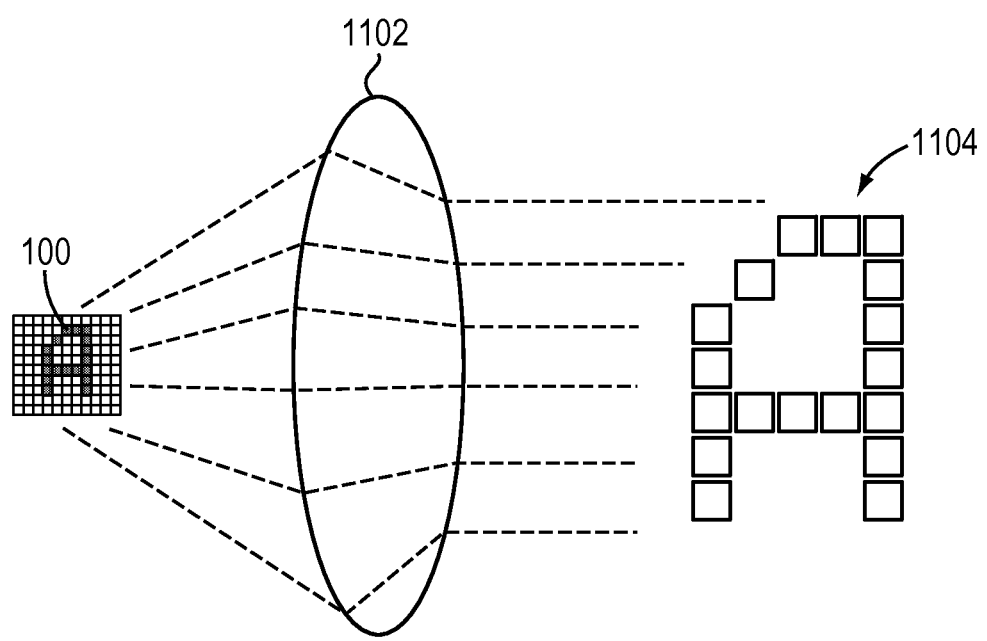
FIG. 11 illustrates that a character created by the LED array is projected onto a surface in accordance with various embodiments.

In a lighting application, the LEDs may form a two-dimensional addressable array and be attached to an imaging optic (e.g., a collimating optic) to create a projectable sign. Referring to FIG. 11, the LED array 100 may be arranged to create a dot-matrix character "A"; the imaging optic 1102 projects light emitted from the LED array 100 onto a surface 1104 for displaying the same image (i.e., the dot-matrix character "A"). The resolution of the displayed image is limited by the individual LED size and the spacing between LEDs—i.e., as the size of individual LEDs decreases and/or the space between them diminishes, the resolution of the projected image increases. Therefore, using an LED array that has a closer spacing (e.g., fabricated by the semiconductor process described above) allows for display of a more complex image. In addition, differently colored LEDs that can be individually addressed or addressed in multiple groups (each having multiple LEDs) may be used with an optic to generate a wide range of colors of the projected image. In one implementation, a motor or other mechanical means is incorporated in the LED system to move the LED array for creating a large, high-resolution image without the need to increase the dimensions of the LED array. Additionally, a sensor may be used to detect the movement of the LED array 100 (e.g., its relative position with respect to the start point and expected end point of the motion). Based on the detected movement and/or a predicted movement in accordance with the movement history, a parameter of the LED array (e.g., individual color or intensity, or emitting pattern) may be adjusted via addressing individual LEDs or groups of LEDs to create a different image. When the movement of the LED array is sufficiently fast, the projected sequence may form a word or sentence. When the motion of the LED array is two dimensional, a multiline message or image may be projected.

Light sources in accordance herewith need not necessarily employ parabolic reflectors, but may, generally, use any concave reflector. For example, in some embodiments, the reflective surface is shaped like a portion of a sphere, cone, ellipsoid, or hyperboloid, or in a manner that does not correspond to any geometric primitive. Non-parabolic reflectors generally do not possess a unique focal point where all reflected rays originating from a collimated incident beam intersect, but direct the reflected rays towards the same region; the brightest point within this region is herein regarded the focus of the reflector. The absence of a unique focal point may contribute to the divergence of the beam and/or the blurring of non-uniformities in the intensity distribution of the LED arrangement (or other extended light-emitting surface). Notwithstanding this inherent "mixing" of light from different LEDs, non-parabolic reflectors may be faceted to further increase the beam divergence and/or quality and uniformity of the output beam.

Furthermore, the LED arrangement need not in all embodiments be placed at a plane through the focus of the optic. In some embodiments, it may be advantageous to move the LED arrangement slightly out of focus, e.g., by 10%, 20%, or 30% of the focal length. Removing the LEDs from the focal plane may further increase the beam divergence and/or help blur the individual LED die. However, if the LEDs are moved too far away from the focal plane, the reflector's function to create a directed light beam may be undermined. Therefore, in typical embodiments, the LED arrangement is place substantially at the focal plane, i.e., no more than about 10% of the focal length away from the focal plane.

Figure 12A:
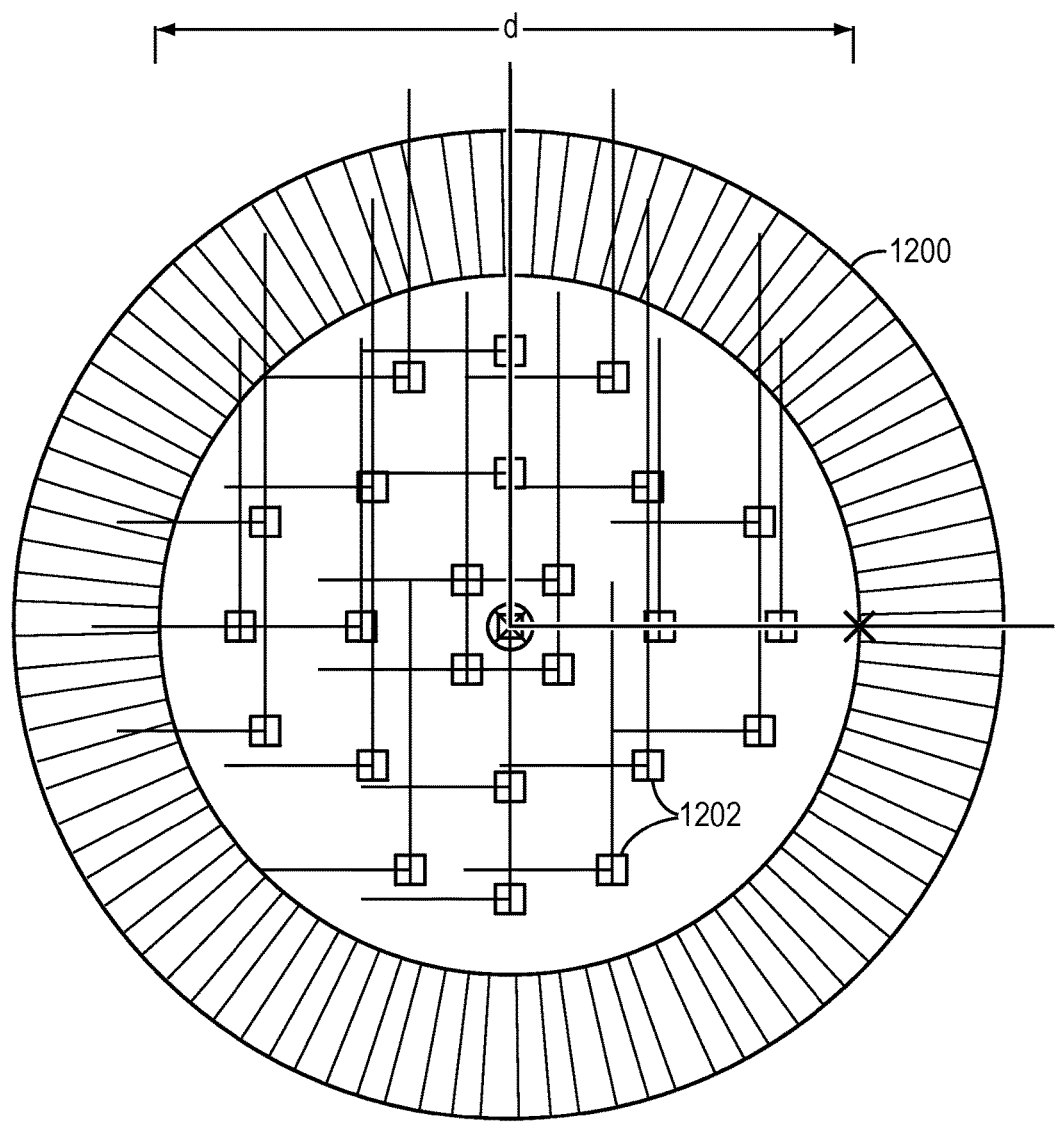
FIG. 12A illustrates an LED arrangement in accordance with various embodiments.
Figure 12B:
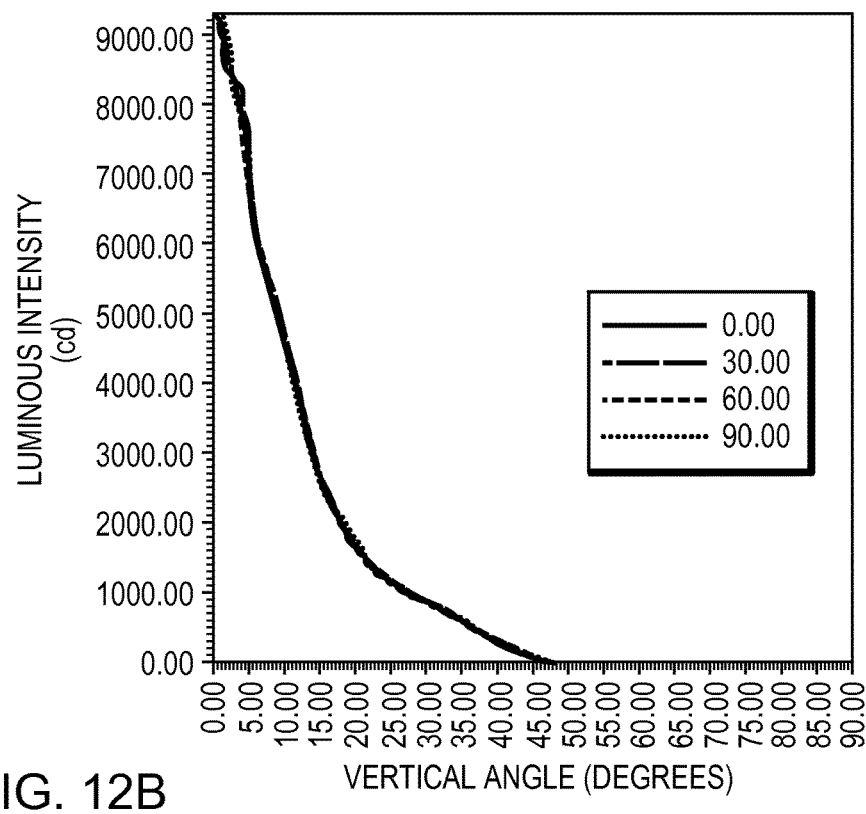
FIG. 12B shows the computed intensity profile of an output beam generated with the LED arrangement of FIG. 12A and a parabolic reflector in accordance with various embodiments.
Figure 12C:
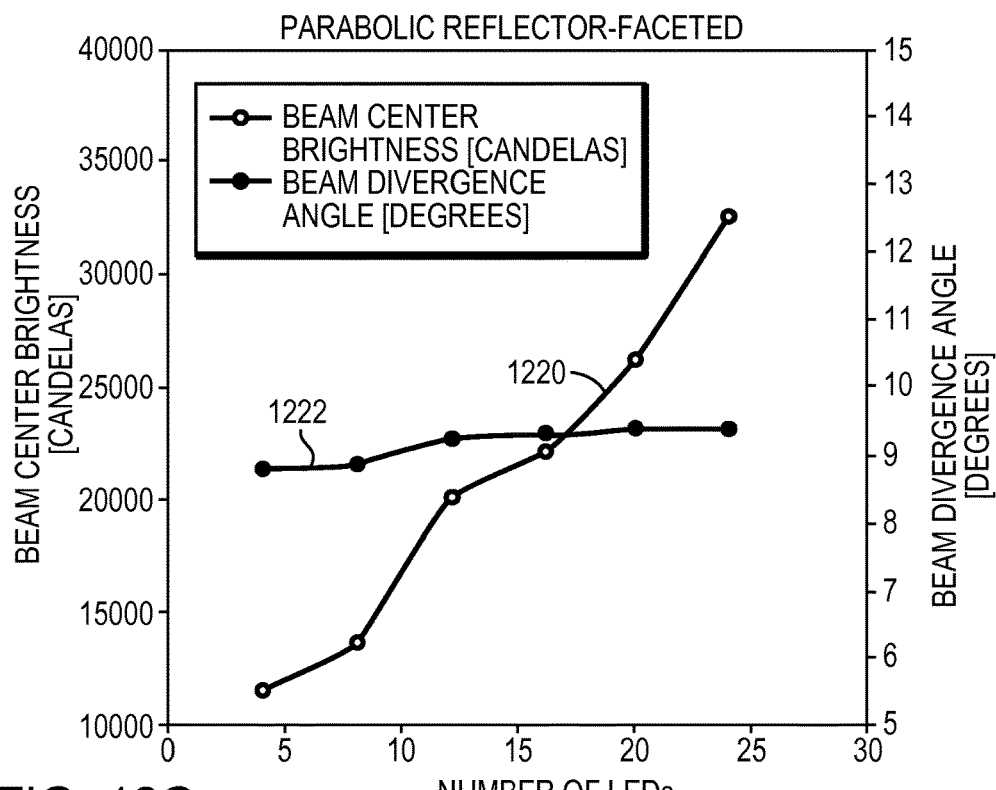
FIG. 12C shows a plot of the computed center-beam brightness and divergence angle of the output beam generated with the LED arrangement of FIG. 12A and a parabolic reflector in accordance with various embodiments.

FIGS. 12B-12E provide a comparison between the output beam characteristics achieved with parabolic and conical reflectors, respectively; the shown data is based on computational modeling. FIG. 12A shows the arrangement 1200 of LEDs underlying these calculations; herein, twenty-four LEDs 1202 are arranged along three concentric, approximately circular closed curves, with four LEDs on the central circle, eight LEDs on the middle circle, and twelve LEDs on the outer circle. The diameter of the LED arrangement is approximately 12 mm, and the LEDs are placed in the focal plane of the optic. FIG. 12B illustrates the intensity profile of the output beam created with a faceted parabolic reflector having an opening angle θ of about 70° divided into fourteen facets of 5° each, with 54 azimuthal facets and a focal length of about 3 mm; the luminous intensity is plotted against the angle relative to the optical axis. As can be seen, the intensity gradually falls off from a peak intensity at the optical axis towards zero at about 45°, following approximately a Lambertian distribution. The beam divergence, i.e., the full width of the beam between the points of half-maximum intensity on either side of the optical axis, is approximately 20°. The lack of smoothness in the curve is due to the non-uniform intensity of the LED array and the facets. FIG. 12C shows the beam divergence 1220 and center beam brightness 1222 plotted against the number of LEDs that are turned on (starting from the inner-most circle and moving outward). The angle of divergence increases proportionately to the number of active LEDs, achieving an overall beam-angle variation of about 3:1. The center beam intensity is substantially constant (i.e., varies, in this embodiment, by less than about 10%).

Figure 12D:
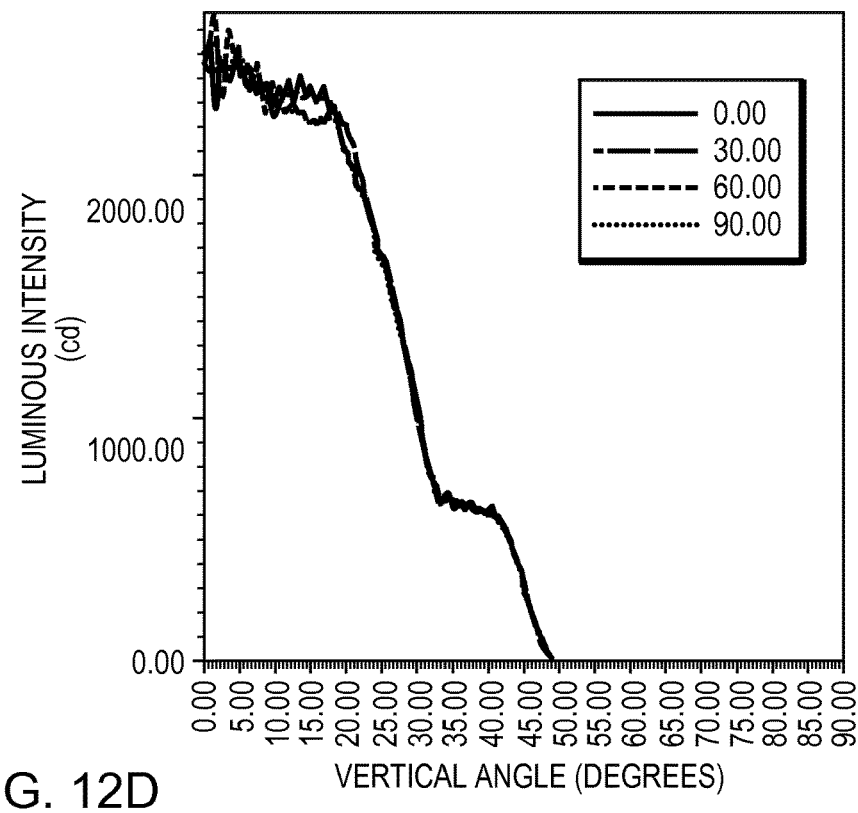
FIG. 12D shows the computed intensity profile of an output beam generated with the LED arrangement of FIG. 12A and a conical reflector in accordance with various embodiments.
Figure 12E:
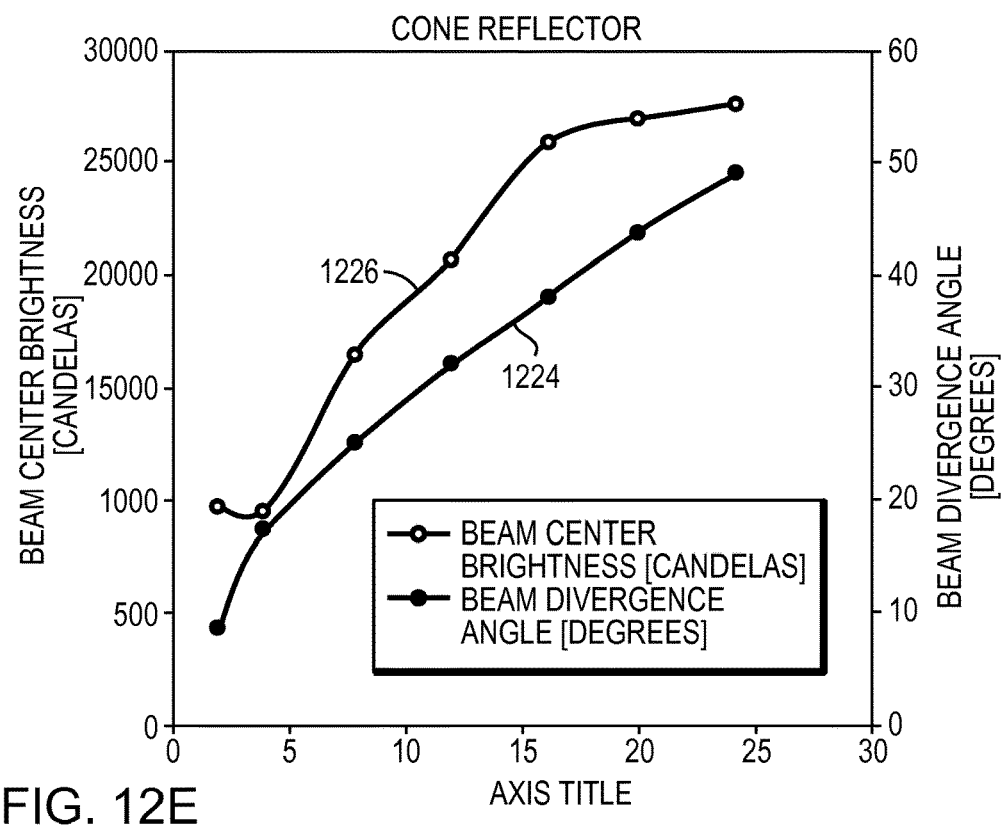
FIG. 12E shows a plot of the computed center-beam brightness and divergence angle of the output beam generated with the LED arrangement of FIG. 12A and a conical reflector in accordance with various embodiments.

FIG. 12D shows, for comparison with FIG. 12B, the intensity profile generated with a conically shaped reflector (and the same LED arrangement); the reflector has an opening angle (measured between the optical axis and the surface of the cone) of about 53°, an entry surface of about 25 mm in diameter, an aperture about 40 mm in diameter, and 54 azimuthal facets. Here, the luminous intensity as a function of the angle relative to the optical axis is not as close to Lambertian in shape, but still falls off gradually. More light is distributed away from the center of the beam, resulting in a lower center-beam intensity and a wider beam-divergence angle (which is, in this case, about 60°. FIG. 12E illustrates how the divergence 1224 and center-beam brightness 1226 change for the conical reflector as LEDs are successively turned on (starting closest to the center of the arrangement). As shown, the beam divergence increases proportionately to the number of LEDs, as with the parabolic reflector. However, unlike the center-beam brightness resulting for the parabolic reflector, the center-beam brightness increases, for the conical reflector, significantly with the number of active LEDs. For some applications, this correlation between increasing peak intensity and increasing divergence may be advantageous. Accordingly, the shape of the reflector may be chosen based on the desired behavior the beam as LEDs are turned on or off, among other criteria (such as ease of manufacturing, beam quality, etc.).

Reflectors for light sources in accordance herewith come in various sizes and with various optical characteristics. The opening angle θ of the reflector typically varies, for practical reasons, between about 20° and about 80°. For parabolic reflectors with a focal length of, for instance, about 3 mm, this range corresponds to aperture diameters ranging from about 17 mm to about 136 mm and to aperture-to-focal-length ratios between about 5.7 (for 20°) to about 48 (for 80°). Of course, other focal lengths are possible; in typical embodiments, the focal length is on the order of a few millimeters to a few centimeters. The aperture is typically at least three or four times as large as the focal length, facilitating LED arrangements with diameters greater than the focal length (and, of course, smaller than the aperture diameter), which result in significant beam divergence (if all LEDs are activated) and high brightness (since a significant portion of the emitted light is captured by the optic). Note that these desirable ratios between the focal length, the aperture of the optic, and the size of the LED arrangement are generally not achievable in practice with refractive optics.

In addition to changing the beam angle, light sources in accordance with various embodiments also facilitate brightening or dimming the beam as a whole by changing the brightness of all the LEDs (or just the ones that define the desired beam angle), via the drive currents, simultaneously and uniformly. Thus, the drive circuitry may be provided with two controls for adjusting the beam, one that controls beam angle, and another one that controls brightness. Each control may include a user-controlled input element, such as a rotatable knob or a slider, that allows the user to set the desired angle or brightness, and circuitry that controls the drive currents to the individual elements based on the setting of the input element.

Further, while the exemplary embodiments illustrated in FIGS. 2A-2C, 3B, 6A, 6D, and 12A have LED arrays composed of identical LEDs, the invention is not limited in this way; rather, multiple different types of LEDs, including LEDs of different sizes, power, brightness, or color may be used. The particular selection and arrangement of LEDs may be tailored to specific applications and desired beam profiles and dependencies on beam angle. For example, the fall-off of center beam brightness with beam angle may be controlled, to a large degree, by putting a higher-power LED at the center of the array and driving it at a higher current than the smaller-die LEDs surrounding it. The resulting slightly larger die area may increase the lower limit of the beam angle, but would raise the center beam brightness to a level comparable to that sustained with the smaller LEDs. In light sources with multiple types of LEDs, the control circuitry preferably allows regulating the relative currents to the individual LEDs as a function of die size and position.

In some embodiments, the array may include multiple sets of colored LEDs. With such arrays, white light may be created by using optics that are textured or faceted to cause mixing of the light. Furthermore, by using differently colored LEDs (such as red, green, blue, and yellow LEDs) and powering them so as to create different light outputs of each color and then mixing the colors (e.g., using faceted optics), a broad range of colors may be created for decorative effects.

In certain embodiments, the LED driver is capable of addressing LEDs in a programmable fashion. The driver may be provided with a set of standard programs, and/or facilitate programming by the user. Further, in some embodiments, multiple programs may be run in parallel. For example, one program may serve to successively turn the LEDs on, beginning at the center of the array and moving towards the periphery, to increase beam angle, while another program may power all active LEDs at a constant current that may be varied from near-zero to a maximum value to adjust brightness. Other programs may be used to selectively turn on LEDs in sufficient numbers to create a recognizable illumination pattern. Such patterns may be projected onto surfaces and seen at a great distance. While, for the creation of uniform beams, faceted optics may be advantageous, pattern creation generally relies on accurately imaging and bringing the selected LEDs into resolution such that smooth imaging optics may be preferable.

Figure 13:
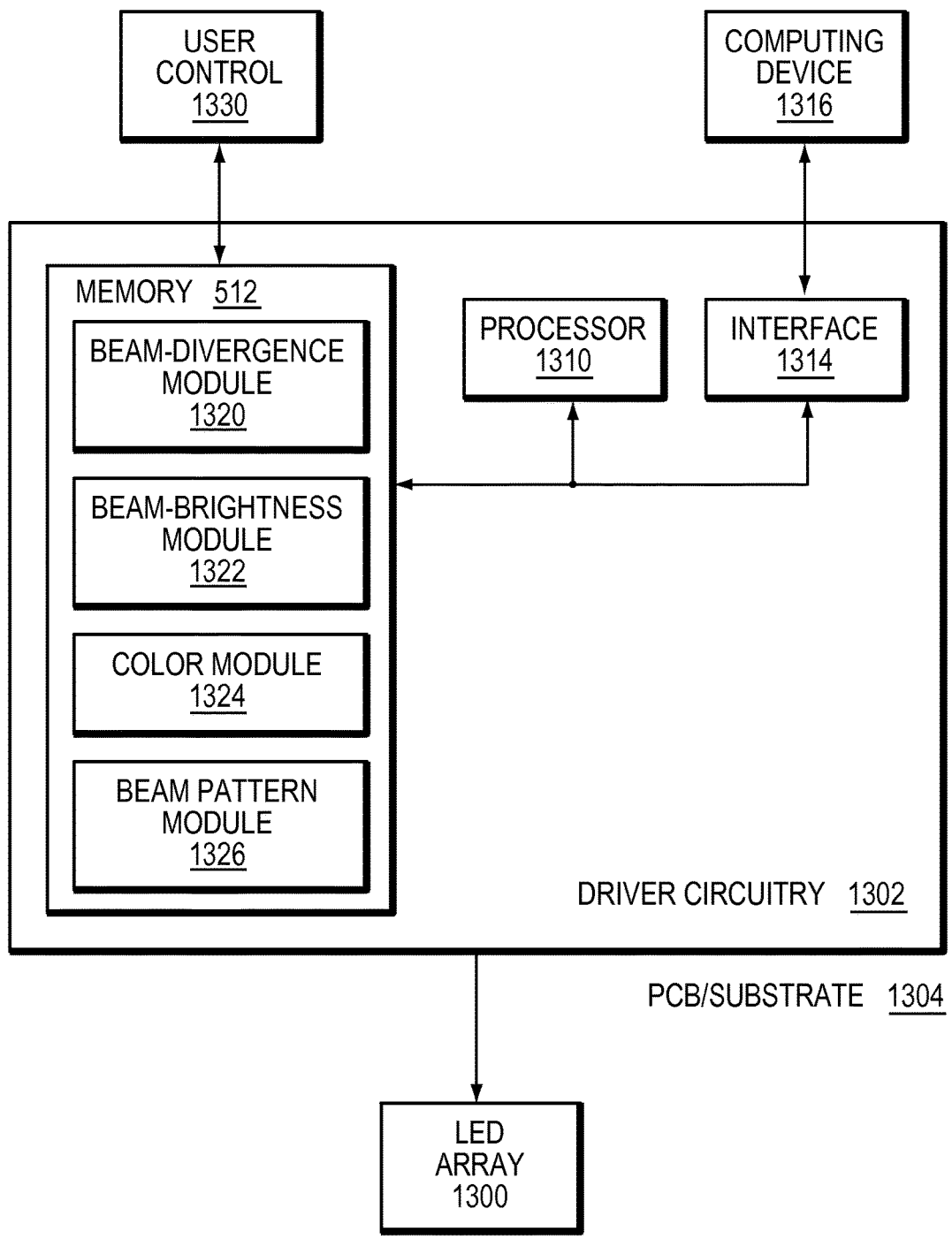
FIG. 13 schematically illustrates an exemplary implementation of the control functionality for light sources in accordance with various embodiments.

The driver circuitry 120 may generally be implemented in hardware, firmware, software, or any combination thereof. In various embodiments, the driver circuitry 120 is provided by analog circuitry, a digital-signal processor (DSP), a programmable gate array (PGA) or field-programmable gate array (FPGA), an application-specific integrated circuit (ASIC), a microcontroller, or any other kind of processing device. Typically, the driver circuitry 120 is wholly or partially integrated with the LED array 100 in a single structure; for instance, the driver circuitry 120 may be provided on the PCB or semiconductor substrate that carries the LED die. In some embodiments, shown in FIG. 13, the control functionality for the LED arrangement 1300 is distributed between driver circuitry 1302 on the LED-carrying PCB or substrate 1304 and a separate component communicatively connected therewith via a wired or wireless connection. For example, as shown, the light source may include an on-board processor 1310 and associated memory 1312, as well as a wired or wireless interface 1314 (e.g., a RF transceiver) for communicating with an external computing device 1316. The memory 1312 may store one or more programs, conceptually illustrated as program modules 1320, 1322, 1324, 1326, for implementing various functionalities of the light source, such as adjusting the beam divergence, varying the overall brightness of the beam, changing the color profile of the beam (for embodiments that include LEDs of different colors), and/or creating a certain beam pattern, or for implementing a particular functionality in different ways. For example, to gradually increase the beam divergence, the LEDs may be turned on one by one or, alternatively, in groups (e.g., of concentric circular sub-arrangements), generally beginning at the center of the arrangement.

The on-board circuitry may be re-programmed via the external computing device 516, which may, e.g., be a general-purpose computer (typically including a CPU, system memory, one or more mass storage devices, user input/output devices such as a keyboard and screen, and a system bus connecting these components). Alternatively, the light source may be controlled in real-time by control signals sent from the computing device 1316 to the on-board driver circuitry 1302. Adjustments of the beam divergence and/or other beam property may be responsive to sensor measurements of the illuminated scene or elsewhere in the environment. For example, the drive current to all LEDs may be increased if a decrease in the beam brightness, resulting, e.g., from aging of the LEDs, is observed. Further, to ensure that the LED array is not overheated (which could quickly damage the LEDs), the light source may include a temperature sensor, e.g., a thermistor placed behind the LED-carrying PCB, and the drive currents to the LEDs may be automatically set, by built-in circuitry, so as to not exceed a maximum allowable current for the measured temperature (as may be calibrated and stored, e.g., in the form of a look-up table in the memory 1312. When only a few of the LEDs are turned on, the drive currents to these LEDs may be increased since the overall power is lower and the danger of overheating is, thus, reduced. In some embodiments, the light source includes one or more user controls 1330, such as manual dials or a keypad, for adjusting the light output; these controls 1330 may be provided within or integrated into the same housing that holds the LED arrangement and reflector.

Light sources in accordance herewith may be employed for various purposes and in a various environments. One valuable application is a flashlight that creates a beam with a continuously variable beam angle without requiring movement of optical components. As another example, light sources in accordance herewith may find uses in theaters, museums, and commercial establishments where various scenes are to be created through different lighting. Achieving such different lightings electronically avoids the need for exchanging lights, lenses, and other items, rendering adjustments significantly more convenient and cost-effective; it also allows using feedback, such as camera images of the illuminated scene, to automatically adjust the beam based thereon. Yet another application is the use of light patterns for signaling purposes; for example, an advertisement, or text providing information regarding an emergency situation or conveying a call for help, may be projected onto a building.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. For example, while the invention has been described with respect to embodiments utilizing LEDs, light sources incorporating other types of light-emitting devices (including, e.g., laser, incandescent, fluorescent, halogen, or high-intensity discharge lights) may similarly achieve variable beam divergence if the drive currents to these devices are individually controlled in accordance with the concepts and methods disclosed herein. Accordingly, the described embodiments are to be considered in all respects as only illustrative and not restrictive.

What is claimed is:

1. A light source producing a beam of variable divergence, comprising:
    a plurality of light-emitting devices arranged on a plane that includes a first set of light emitting devices positioned around a second set of light emitting devices;
    a concave reflecting optic having an axis of symmetry traveling through the second set of light emitting diodes, and comprising a plurality of segments for reflecting at least a portion of light emitted by the light-emitting devices and reflected by the optic forming a light beam, the segments having an aiming angle which increases gradually with increasing distance from the plane of the plurality of light emitting devices for increasing light divergence of the light beam; and
    driver circuitry for controlling drive currents to the light-emitting devices such that a maximum divergence of the light beam is produced by said driver circuitry powering outermost light emitting devices of the first set of light emitting devices, and a gradually decreasing divergence of the light beam is produced by said driver circuitry decreasing a number of powered outermost light emitting devices of the first set of light emitting devices while selectively powering a combination of the inner light emitting devices of the first set of light emitting devices and the second set of light emitting devices.

2. The light source of claim 1, wherein the reflecting optic comprises two regions, segments in a first region having relatively large aiming angles with respect to the axis of symmetry for providing divergence of the light beam and segments in a second region having relatively small aiming angles with respect to the axis of symmetry for collimating the light beam.

3. The light source of claim 1, wherein the segments are parabolic and the light-emitting devices are disposed substantially at a focus of the parabolic segments.

4. The light source of claim 1, wherein the light-emitting devices are arranged in a pattern having a center, the driver circuitry being configured to control the drive currents to the light-emitting devices based on their distances from the center.

5. The light source of claim 1, wherein the driver circuitry is configured to selectively drive a subset of the light-emitting devices so as to generate a pattern.

6. The light source of claim 1, wherein the driver circuitry is programmable.

7. The light source of claim 1, wherein an area density of the light-emitting devices is uniform.

8. The light source of claim 1, wherein the driver circuitry is configured to control the drive currents based on at least one of sizes or positions of respective light-emitting devices.

9. The light source of claim 1, wherein the light-emitting devices are arranged in a pattern having a center region and an outer region outside the center region, light-emitting devices located in the center region being higher-power devices than light-emitting devices located in the outer region.

10. The light source of claim 1, wherein the aiming angle of each segment with respect to the axis of symmetry increases gradually as the distance between the segment and the plane of the light-emitting devices decreases.

11. The light source of claim 10, wherein the reflecting optic comprises first and second edge segments having a shortest distance and a longest distance, respectively, from the plane of the light-emitting devices, the first edge segment having a first aiming angle approximately equal to a desired divergence angle of the light beam and the second edge segment having a second aiming angle approximately parallel to the axis of symmetry for collimating the light beam.

12. The light source of claim 1, wherein the light-emitting devices are arranged symmetrically.

13. The light source of claim 12, wherein the arrangement of the light-emitting devices is circularly symmetric or radially symmetric.

14. The light source of claim 12, wherein the light-emitting devices are arranged in a pattern having a center region and an outer region outside the center region such that none of the light-emitting devices is located in the center region.

15. The light source of claim 1, wherein the light-emitting devices comprise LEDs.

16. The light source of claim 15, wherein the LEDs are disposed on a single substrate having a plurality of electrical contacts.

17. The light source of claim 16, wherein the substrate comprises a semiconductor material.

18. A method of varying a divergence of a light source comprising (i) a plurality of light-emitting devices arranged on a plane and in a pattern having a center region and an outer region outside the center region, (ii) a concave reflecting optic having an axis of symmetry and a plurality of segments, each segment having an aiming angle with respect to the axis of symmetry for redirecting light emitted thereon, the concave reflecting optic including a portion of the plurality of segments having a gradually increasing aiming angle with increasing distance from the plane of the plurality of light emitting diodes for increasing light divergence, and (iii) a driver circuitry for selectively controlling a drive current supplied to the light emitting devices, the method comprising:

driving the light-emitting devices to create a light beam emerging from the reflecting optic; and controlling the divergence of an output beam of the light source by the driver circuitry controlling drive currents to the light-emitting devices based on distances of the devices from the axis of symmetry, wherein a maximum divergence of the output beam is produced by supplying a drive current to the light emitting devices outermost from the axis of symmetry, and an output beam with a gradually decreasing divergence is produced by selectively supplying a drive current for decreasing a number of powered outermost light emitting devices while powering light emitting devices closer to the axis of symmetry.

19. The method of claim 18, wherein the reflecting optic comprises two regions, segments in a first region having relatively large aiming angles with respect to the axis of symmetry for providing divergence of the light beam and segments in a second region having relatively small aiming angles with respect to the axis of symmetry for collimating the light beam.

20. The method of claim 18, wherein the segments are parabolic and the light-emitting devices are disposed substantially at a focus of the parabolic segments.

21. The method of claim 18, wherein an area density of the light-emitting devices is uniform.

22. The method of claim 18, wherein controlling the drive currents comprises decreasing the drive currents to the light-emitting devices in an outer region thereof to thereby narrow the beam.

23. The method of claim 18, further comprising simultaneously and uniformly varying the drive currents to all light emitting devices to thereby vary the beam brightness.

24. The method of claim 18, wherein the aiming angle of each segment with respect to the axis of symmetry increases gradually as the distance between the segment and the plane of the light-emitting devices decreases.

25. The method of claim 24, wherein the reflecting optic comprises first and second edge segments having a shortest distance and a longest distance, respectively, from the plane of the light-emitting devices, the first edge segment having a first aiming angle approximately equal to a desired divergence angle of the light beam and the second edge segment having a second aiming angle approximately parallel to the axis of symmetry for collimating the light beam.

26. The method of claim 18, wherein the light-emitting devices are arranged symmetrically.

27. The method of claim 26, wherein the arrangement of the light-emitting devices is circularly symmetric or radially symmetric.

28. The method of claim 26, wherein the light-emitting devices are arranged in a pattern having a center region and an outer region outside the center region such that none of the light-emitting devices is located in the center region.

29. The method of claim 18, wherein the light-emitting devices comprise LEDs.

30. The method of claim 29, wherein the LEDs are disposed on a single substrate having a plurality of electrical contacts.

31. The method of claim 30, wherein the substrate comprises a semiconductor material.

* * * * *